United States Patent
Kawahara et al.

(10) Patent No.: US 12,366,690 B2
(45) Date of Patent: Jul. 22, 2025

(54) COLOR CONVERSION SHEET, LIGHT SOURCE UNIT INCLUDING SAME, DISPLAY, AND LIGHTING DEVICE

(71) Applicant: Toray Industries, Inc., Tokyo (JP)

(72) Inventors: Kana Kawahara, Otsu (JP); Tatsuya Kanzaki, Otsu (JP)

(73) Assignee: Toray Industries, Inc., Tokyo (JP)

( * ) Notice: Subject to any disclaimer, the term of this patent is extended or adjusted under 35 U.S.C. 154(b) by 369 days.

(21) Appl. No.: 18/025,828

(22) PCT Filed: Sep. 14, 2021

(86) PCT No.: PCT/JP2021/033673
§ 371 (c)(1),
(2) Date: Mar. 10, 2023

(87) PCT Pub. No.: WO2022/070877
PCT Pub. Date: Apr. 7, 2022

(65) Prior Publication Data
US 2023/0358929 A1    Nov. 9, 2023

(30) Foreign Application Priority Data
Sep. 30, 2020  (JP) ............................. 2020-164821

(51) Int. Cl.
*G02B 5/20* (2006.01)
*C09K 11/06* (2006.01)
(Continued)

(52) U.S. Cl.
CPC .............. *G02B 5/206* (2013.01); *C09K 11/06* (2013.01); *F21V 9/32* (2018.02); *G02F 1/133514* (2013.01); *C09K 2211/1055* (2013.01)

(58) Field of Classification Search
None
See application file for complete search history.

(56) References Cited

U.S. PATENT DOCUMENTS

| 5,446,157 A | 8/1995 | Morgan et al. |
| 10,168,464 B2 | 1/2019 | Harada et al. |

(Continued)

FOREIGN PATENT DOCUMENTS

| JP | H08-509471 A | 10/1996 |
| JP | 2000-208262 A | 7/2000 |

(Continued)

OTHER PUBLICATIONS

Extended European Search Report dated Sep. 30, 2024, from counterpart European Application No. 21875179.0.
(Continued)

*Primary Examiner* — Ryan Crockett
(74) *Attorney, Agent, or Firm* — DLA Piper LLP (US)

(57) ABSTRACT

A color conversion sheet includes at least a color conversion layer, a color conversion layer, a resin layer, and a base layer, the color conversion layer contains a light-emitting material (a) that exhibits light emission with a peak wavelength observed in a region of 500 nm or more and less than 580 nm, the color conversion layer contains a light-emitting material (b) that exhibits light emission with a peak wavelength observed in a region of 580 nm to 750 nm, a haze value of the color conversion sheet is 20% to 90%, and $n_{41}$, $n_{42}$ and $n_B$ satisfy relationships (1) or (2), where $n_{41}$ is a refractive index of the color conversion layer, $n_{42}$ is a refractive index of the color conversion layer, and $n_B$ is a refractive index of the resin layer:

$$n_{A1}>n_B \text{ and } n_{A2}>n_B \quad (1)$$

$$n_{A1}<n_B \text{ and } n_{A2}<n_B. \quad (2)$$

20 Claims, 2 Drawing Sheets

(51) Int. Cl.
*F21V 9/32* (2018.01)
*G02F 1/1335* (2006.01)

(56) References Cited

U.S. PATENT DOCUMENTS

| | | | |
|---|---|---|---|
| 10,784,414 | B2 | 9/2020 | Umehara et al. |
| 2007/0121129 | A1* | 5/2007 | Eida .................. B82Y 30/00 358/1.9 |
| 2013/0082589 | A1* | 4/2013 | So ...................... H10K 59/351 313/504 |
| 2018/0004041 | A1 | 1/2018 | Shin et al. |
| 2019/0048255 | A1 | 2/2019 | Sakaino |
| 2019/0103521 | A1* | 4/2019 | Umehara .......... G02F 1/133605 |
| 2020/0088920 | A1 | 3/2020 | Sakaino et al. |

FOREIGN PATENT DOCUMENTS

| | | |
|---|---|---|
| JP | 2007-256346 | 10/2007 |
| JP | 2011-241160 A | 12/2011 |
| JP | 2014-082191 A | 5/2014 |
| JP | 2016-159445 A | 9/2016 |
| JP | 2017-129743 A | 7/2017 |
| JP | 2018-087951 A | 6/2018 |
| JP | 2018-124413 A | 8/2018 |
| JP | 2018-195583 A | 12/2018 |
| JP | 2019-2019512 A | 12/2019 |
| JP | 2021-076790 A | 5/2021 |
| KR | 10-2016-0094885 A | 8/2016 |
| WO | 2017/057074 A1 | 4/2017 |
| WO | 2017/164155 | 9/2017 |
| WO | 2019/039142 A1 | 2/2019 |

OTHER PUBLICATIONS

Dipl.-Chem. Matthias Kollmannsberger et al., "Electrogenerated Chemiluminescence and Proton-Dependent Switching of Fluorescence: Functionalized Difluoroboradiaza-s-indacenes," Angewandte Chemie International Edition in English, vol. 36, Issue 12, Jul. 4, 1997, pp. 1333-1335 (Abstract).

Armin Burghart et al., "3,5-Diaryl-4,4-difluoro-4-bora-3a,4a-diaza-s-indacene (BODIPY) Dyes: Synthesis, Spectroscopic, Electrochemical, and Structural Properties," J. Org. Chem., vol. 64, No. 21, Sep. 30, 1999, pp. 7813-7819 (Abstract).

Takuji Hatakeyama et al., "Ultrapure Blue Thermally Activated Delayed Fluorescence Molecules: Efficient HOMO-LUMO Separation by the Multiple Resonance Effect," Advanced Materials, vol. 28, Issue 14, Feb. 11, 2016, pp. 2777-2781 (Abstract).

International Search Report dated Nov. 9, 2021 in counterpart International Application No. PCT/JP2021/033673 w/English translation.

Written Opinion dated Nov. 9, 2021 in counterpart International Application No. PCT/JP2021/033673.

* cited by examiner

COLOR CONVERSION SHEET, LIGHT SOURCE UNIT INCLUDING SAME, DISPLAY, AND LIGHTING DEVICE

TECHNICAL FIELD

This disclosure relates to a color conversion sheet, a light source unit including the color conversion sheet, a display, and a lighting device.

BACKGROUND

There are more and more studies about application of multi-coloring technique based on a color conversion method to liquid crystal displays, organic EL displays, lightings and the like. The "color conversion" means that light emitted from a light emitter is converted into light having a longer wavelength, for example, blue light is converted into green light or red light.

When a composition having this color conversion function is formed into a sheet, and combined with a blue light source, light of three primary colors of blue, green and red can be extracted from the blue light source. Hence, it is possible to obtain white light. A white color source obtained by combining a blue light source and a sheet having a color conversion function ("color conversion sheet") as described above is used as a light source unit, and combined with a liquid crystal drive portion and a color filter to enable production of a full-color display. It is also possible to apply the white light source directly as a LED illumination or the like.

As a problem with a liquid crystal display utilizing a color conversion method, there is a variation in color tone of light emitted from a light source in a light-emitting region of a backlight device. As a solution for this problem, a technique has been proposed in which the content of a color conversion material per unit area is increased in a portion of a color conversion sheet which is located at a peripheral edge portion of a display (see, for example, Japanese Patent Laid-open Publication No. 2018-195583).

A technique has also been disclosed in which a light stabilizer is added for preventing deterioration of an organic light-emitting material to improve durability (see, for example, Japanese Patent Laid-open Publication No. 2011-241160).

However, in JP '583, the luminance decreases due to aggregation of a phosphor because the content of a color conversion material is increased, and thus a technique for maintaining sufficient durability is insufficient. In JP '160, sufficient in-plane uniformity cannot be secured, and both in-plane uniformity and durability are not sufficiently achieved.

It could therefore be helpful to provide a color conversion sheet which is used for displays, lighting devices and the like and which has high in-plane uniformity and durability.

SUMMARY

We thus provide a color conversion sheet that converts incident light into light having a wavelength different from that of the incident light, in which the color conversion sheet includes at least a color conversion layer (A), a color conversion layer (B), a resin layer, and a base layer, the color conversion layer (A) contains a light-emitting material (a) that exhibits light emission with a peak wavelength observed in a region of 500 nm or more and less than 580 nm, the color conversion layer (B) contains a light-emitting material (b) that exhibits light emission with a peak wavelength observed in a region of 580 nm or more and 750 nm or less, a haze value of the color conversion sheet is 20% or more and 90% or less, and $n_{A1}$, $n_{A2}$ and $n_B$ satisfy relationship (1) or (2), where $n_{A1}$ is a refractive index of the color conversion layer (A), $n_{A2}$ is a refractive index of the color conversion layer (B), and $n_B$ is a refractive index of the resin layer:

$$n_{A1} > n_B \text{ and } n_{A2} > n_B \quad (1)$$

$$n_{A1} < n_B \text{ and } n_{A2} < n_B. \quad (2)$$

Our color conversion sheet may convert incident light into light having a wavelength different from that of the incident light, in which the color conversion sheet includes at least a color conversion layer (A), a color conversion layer (B), a resin layer and a base layer, the color conversion layer (A) contains a light-emitting material (a) that exhibits light emission with a peak wavelength observed in a region of 500 nm or more and less than 580 nm, the color conversion layer (B) contains a light-emitting material (b) that exhibits light emission with a peak wavelength observed in a region of 580 nm or more and 750 nm or less, a haze value of the color conversion sheet is 20% or more and 90% or less, either or both of the color conversion layer (A) and the color conversion layer (B) contain light scattering particles, and $|H_A - H_B| \geq 20\%$ is satisfied, where $H_A$ is a haze of the color conversion layer (A), and $H_B$ is a haze of the color conversion layer (B).

Our color conversion sheet may convert incident light into light having a wavelength different from that of the incident light, in which the color conversion sheet includes at least a color conversion layer, a resin layer and a base layer in this order, the color conversion layer contains a light-emitting material (a) that exhibits light emission with a peak wavelength observed in a region of 500 nm or more and less than 580 nm and a light-emitting material (b) that exhibits light emission with a peak wavelength observed in a region of 580 nm or more and 750 nm or less, a haze value of the color conversion sheet is 20% or more and 90% or less, and $n_A > n_B$ and $n_B < n_C$ is satisfied, where $n_A$ is a refractive index of the color conversion layer, $n_B$ is a refractive index of the resin layer, and $n_C$ is a refractive index of the base layer.

Our color conversion sheets exhibit an effect of achieving both high in-plane uniformity and durability. Our light source unit, the display, and the lighting device include such a color conversion sheet, and thus exhibits an effect of enabling achievement of high in-plane uniformity and durability.

DESCRIPTION OF REFERENCE SIGNS

Figure 1:
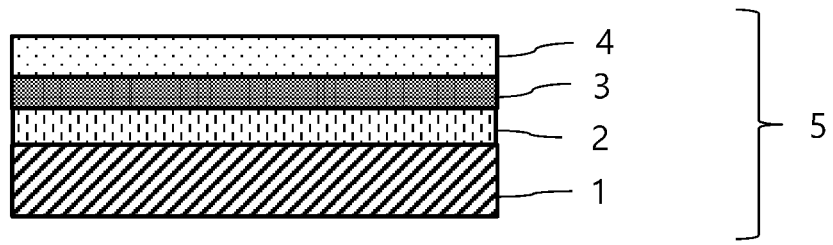
FIG. 1 is a schematic sectional view showing an example of a color conversion sheet.

1: Base layer
2: Color conversion layer (B)
3: Resin layer

4: Color conversion layer (A)
5: Color conversion sheet
6: Barrier layer
7: Color conversion layer
8: Substrate
9: Reflection layer
10: Light source
11: Diffusion plate
12: Prism sheet
13: Polarizing reflective film
14: Light source unit

DETAILED DESCRIPTION

Hereinafter, examples of our sheets, units, displays and devices will be specifically described. However, this disclosure is not limited to the following examples, and various modifications can be made depending on purposes and applications.

Our color conversion sheet is a color conversion sheet that converts incident light from a light source or the like into light having a wavelength different from that of the incident light, and the color conversion sheet includes at least a color conversion layer (A), a color conversion layer (B), a resin layer, and a base layer. The color conversion layer (A) contains a light-emitting material (a) that exhibits light emission with a peak wavelength observed in a region of 500 nm or more and less than 580 nm, and the color conversion layer (B) contains a light-emitting material (b) that exhibits light emission with a peak wavelength observed in a region of 580 nm or more and 750 nm or less.

The peak wavelength of light emission of a light-emitting material (e.g., the above-described light-emitting material (a) and light-emitting material (b)) can be determined by fluorescence spectral measurement of a solution of the light-emitting material. A solvent for use in this fluorescence spectral measurement is not limited to a particular solvent; a solvent such as toluene, dichloromethane, or tetrahydrofuran can be suitably used. Toluene is more preferably used as this solvent as long as there is no problem about the solubility of the light-emitting material.

In the following, the light emission with a peak wavelength observed in the region of 500 nm or more and less than 580 nm is referred to as "green light emission." The light emission with a peak wavelength observed in the region of 580 nm or more and 750 nm or less is referred to as "red light emission."

Light applied to a light-emitting material for the light-emitting material to emit light is referred to as excitation light. In general, the excitation light having larger energy is more likely to cause the decomposition of a material. Excitation light having a wavelength of 400 nm or more and 500 nm or less has relatively low energy, does not cause decomposition of a light-emitting material in a color conversion composition, and therefore ensures that light emission with a good color purity is obtained. Excitation light is used as incident light from a light source or the like, which is incident to the color conversion sheet.

A part of excitation light having a wavelength of 400 nm or more and 500 nm or less is transmitted through the color conversion sheet without being converted into light having a different wavelength so that the excitation light itself can be utilized as blue light emission. The color conversion sheet contains the light-emitting material (a) that exhibits green light emission and the light-emitting material (b) that exhibits red light emission. Consequently, when a blue LED light source with an emission peak having a sharp shape is combined with the color conversion sheet to obtain a white light source, it is possible to obtain white light which has a light emission spectrum having a sharp shape in each of the colors of blue, green and red, and has a good color purity. As a result, in particular, displays using such a white light source are more vivid in color and enable a larger color gamut to be efficiently created. In lighting devices, a preferred white light source having improved color rendering properties can be obtained because light emission characteristics particularly in the green region and the red region are improved as compared to a white LED obtained by combining a currently prevailing blue LED with a yellow phosphor.

To expand the color gamut to improve color reproducibility of the display, it is preferred that there is little overlap between the light emission spectra of the colors of blue, green and red.

For example, when blue light having a wavelength of 400 nm or more and 500 nm or less is used as excitation light, conversion of blue light into green light using the light-emitting material (a) that exhibits light emission with a peak wavelength observed in a region of 500 nm or more reduces overlap between the light emission spectra of the excitation light and the green light to improve color reproducibility. To further enhance the effect, the lower limit value of the peak wavelength of the light-emitting material (a) is more preferably 510 nm or more, still more preferably 515 nm or more, particularly preferably 520 nm or more.

To reduce overlap between the light emission spectra of the excitation light and the red light, it is preferred to use the light-emitting material (a) that exhibits light emission with a peak wavelength observed in a region of 580 nm or less. To further enhance the effect, the upper limit value of the peak wavelength of the light-emitting material (a) is more preferably 550 nm or less, still more preferably 540 nm or less, particularly preferably 535 nm or less.

Further, when the light-emitting material (a) that exhibits light emission with a peak wavelength observed in a region of 500 nm or more and less than 580 nm and the light-emitting material (b) that exhibits light emission with a peak wavelength observed in a region of 580 nm or more, overlap between the light emission spectra of green light and red light decreases to improve color reproducibility. To further enhance the effect, the lower limit value of the peak wavelength of the light-emitting material (b) is more preferably 610 nm or more, still more preferably 620 nm or more, particularly preferably 630 nm or more.

The upper limit of the peak wavelength of the light-emitting material (b) may be equal to or less than 750 nm, i.e., near the upper limit of the visible range, and is preferably 700 nm or less because the visibility increases. To further enhance the effect, the upper limit value of the peak wavelength of the light-emitting material (b) is still more preferably 680 nm or less, particularly preferably 660 nm or less.

That is, when blue light having a wavelength of 400 nm or more and 500 nm or less is used as excitation light, the peak wavelength of the light-emitting material (a) is observed in a region of preferably 500 nm or more and less than 580 nm, more preferably 510 nm or more and 550 nm or less, still more preferably 515 nm or more and 540 nm or less, particularly preferably 520 nm or more and 535 nm or less. The peak wavelength of the light-emitting material (b) is observed in a region of preferably 580 nm or more and 750 nm or less, more preferably 610 nm or more and 700 nm or less, still more preferably 620 nm or more and 680 nm or less, particularly preferably 630 nm or more and 660 nm or less.

To reduce overlap between light emission spectra to improve the color purity and color reproducibility, the full width at half maximum of the emission spectrum of each of the colors of blue, green and red is preferably small. In particular, that the full width at half maximum of the light emission spectrum of each of green light and red light is small is effective in improving the color purity and color reproducibility.

As described above, the color conversion sheet has at least two color conversion layers, that is, the color conversion layer (A) containing the light-emitting material (a) and the color conversion layer (B) containing the light-emitting material (b). It is preferred that the light-emitting material (a) and the light-emitting material (b) are contained in different layers because the interaction between the materials is suppressed so that light emission with a higher color purity can be exhibited compared to when the light-emitting material (a) and the light-emitting material (b) are dispersed in the same layer. In addition, the light-emitting material (a) and the light-emitting material (b) emit light independently in respective layers, it is easy to adjust the emission peak wavelength and the emission intensity of each of green and red.

Figure 2:
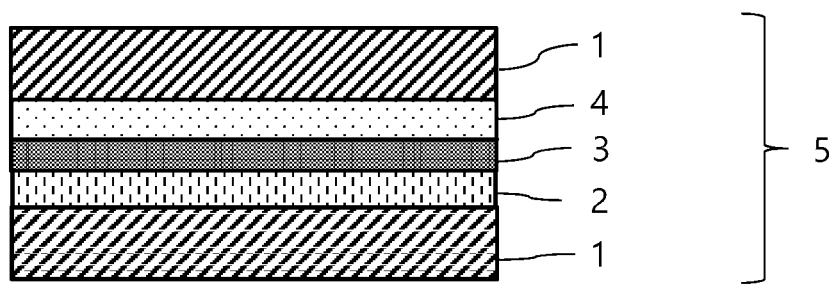
FIG. 2 is a schematic sectional view showing an example of a color conversion sheet.

For example, FIG. 1 shows a typical structural example of the color conversion sheet. FIG. 1 is a schematic sectional view showing an example of the color conversion sheet. A color conversion sheet 5 shown in FIG. 1 includes a base layer 1, and a color conversion layer (B)2, a resin layer 3 and a color conversion layer (A)4 in this order on the base layer 1. FIG. 2 shows another example of the color conversion sheet. The color conversion sheet shown in FIG. 2 may have a structure in which the base layer 1 is further disposed on the color conversion layer (A)4 so that the color conversion layer (B)2, the resin layer 3, and the color conversion layer (A)4 are sandwiched between the base layers 1.

The above-described structural examples are illustrative, and the specific configuration of the color conversion sheet according to the example is not limited to thereto, and configurations obtained by appropriately changing the matters derived from the following description are also within the scope of this disclosure.

Haze Value of Color Conversion Sheet

The color conversion sheet has a haze value of 20% or more and 90% or less. When the haze value is in the above-described range, scattering of light in the color conversion layer increases, and therefore the light conversion efficiency of the light-emitting material is improved so that it is possible to secure both the in-plane uniformity and the durability of the color conversion sheet. The haze value is more preferably 50% or more and 75% or less. The haze value can be measured in accordance with ASTM D 1003 (2013).

The method of setting the haze value of the color conversion sheet within the above-described range is not particularly limited, and examples thereof include a method in which light scattering particles are incorporated into the color conversion layer, a method in which a light scattering layer is provided separately from the color conversion layer, and a method in which the surface roughness of a base layer formed into the color conversion sheet is increased. Among them, a method is more preferred in which light scattering particles are incorporated into the color conversion layer.

As an example of the color conversion sheet when either or both of the color conversion layer (A) and the color conversion layer (B) contain light scattering particles, $|H_A-H_B|$ is preferably 20% or more, where $H_A$ is a haze of the color conversion layer (A), and $H_B$ is a haze of the color conversion layer (B). The absolute value of a haze difference between the color conversion layer (A) and the color conversion layer (B) has a significant effect on the color gamut and luminance of the resulting display. When the difference between $H_A$ and $H_B$ is the above-described range, it is possible to obtain a color conversion sheet having a high color gamut and a high luminance as described later.

Light Scattering Particles

Examples of the light scattering particles that control the haze include organic and/or inorganic particles.

Specific examples thereof include particles formed of glass, titania, silica, alumina, silicone resin, zirconia, ceria, aluminum nitride, silicon carbide, silicon nitride, barium titanate, acrylic resin and the like. A single type of these particles may be used, or two or more types thereof may be used in combination. From the viewpoint of being easily available, particles selected from silica particles, alumina particles, titania particles, zirconia particles, acrylic resin particles, silicone resin particles and the like are preferred. Titania particles are more preferred from the viewpoint of dispersibility in the binder resin in the color conversion layer.

From the viewpoint of improving the luminance, it is preferred that the light scattering particles include particles selected from alumina particles, silica particles and silicone resin particles. It is preferred that $n_{A1}$, $n_{A2}$, $n_{D1}$ and $n_{D2}$ satisfy $0.03 \leq |n_{A1}-n_{D1}| \leq 0.3$ and/or $0.03 \leq |n_{A2}-n_{D2}| \leq 0.3$, where $n_{D1}$ is a refractive index of light scattering particles contained in the color conversion layer (A), and $n_{D2}$ is a refractive index of light scattering particles contained in the color conversion layer (B). When the difference between $n_{A1}$ and $n_{D1}$ and/or the difference between $n_{A2}$ and $n_{D2}$ are in the above-mentioned ranges, it is possible to achieve both a high haze and a high transmittance. When both the color conversion layer (A) and the color conversion layer (B) contain light scattering particles, it is preferred to satisfy $0.03 \leq |n_{A1}-n_{D1}| \leq 0.3$ and $0.03 \leq |n_{A2}-n_{D2}| \leq 0.3$.

The average particle diameter of the light scattering particles is not particularly limited as long as the haze value is within the above-described range, and the average particle diameter of the light scattering particles is preferably 100 nm to 5000 nm, more preferably 100 nm to 500 nm. By using a particle scatterer having an average particle diameter in this range, dispersibility in the binder resin is improved so that light scattering efficiency of the light-emitting material is improved.

It is preferred that either or both of the color conversion layer (A) and the color conversion layer (B) contain light scattering particles. It is preferred that the light scattering particles are contained such that the amount thereof is larger in one of the color conversion layer (A) and the color conversion layer (B) than in the other. When the color conversion layer (A) contains light scattering particles, the light emission efficiency of the layer (A) is improved so that the peak wavelength is shortened to obtain a color conversion sheet having a larger color gamut. When the color conversion layer (B) contains light scattering particles, the color conversion efficiency of the layer (B) is improved so that self-absorption is suppressed to shorten the peak wavelength. When the peak wavelength of the color conversion layer (B) is shortened, the peak wavelength can be brought closer to the visibility peak so that it is possible to obtain a color conversion sheet having a higher luminance. Therefore, from the viewpoint of the high color gamut, it is preferred that the content of light scattering particles in the color conversion layer (A) is larger than the content of light scattering particles in the color conversion layer (B), and it is most preferred that only the color conversion layer (A) contains light scattering particles. On the other hand, from the viewpoint of the high luminance, it is preferred that the content of light scattering particles in the color conversion layer (B) is larger than the content of light scattering particles in the color conversion layer (A), and it is most preferred that only the color conversion layer (B) contains light scattering particles.

When a pyrromethene derivative described later or a compound represented by General Formulae (6) or (7) and having a small Stokes shift is used as the light-emitting material contained in the color conversion layer, self-absorption intensifies so that a remarkable effect is produced in the high luminance and the high gamut resulting from the unevenness of light scattering particles.

Resin Layer

The color conversion sheet includes a resin layer. It is preferred that the resin layer is present between the color conversion layer (A) and the color conversion layer (B). Where $n_{A1}$ is a refractive index of the color conversion layer (A), $n_{A2}$ is a refractive index of the color conversion layer (B), and $n_B$ is a refractive index of the resin layer, $n_{A1}$, $n_{A2}$ and $n_B$ satisfy relationship (1) or (2):

$$n_{A1} > n_B \text{ and } n_{A2} > n_B \quad (1)$$

$$n_{A1} < n_B \text{ and } n_{A2} < n_B. \quad (2)$$

A resin layer satisfying relationship (1) is referred to as a low-refractive layer, and a resin layer satisfying relationship (2) is referred to as a high-refractive layer. When the resin layer has a refractive index different from that of the color conversion layer, color conversion efficiency can be improved because light is reflected at an interface between conversion layer of each color and the resin layer. It is more preferred that the resin layer is less refractive than the color conversion layer because compared to when the resin layer is a high-refractive layer, a larger amount of light can be reflected so that leakage of light to the outside can be suppressed.

Low-Refractive Layer

As described above, one example of the color conversion sheet is a color conversion sheet including a low-refractive layer as a resin layer. It is preferred that the low-refractive layer is present between the color conversion layer (A) and the color conversion layer (B). Where $n_{A1}$ is a refractive index of the color conversion layer (A), $n_{A2}$ is a refractive index of the color conversion layer (B), and $n_B$ is a refractive index of the low-refractive layer, it is necessary to satisfy $n_{A1} > n_B$ and $n_{A2} > n_B$. Since the low-refractive layer is present, light is reflected at an interface between each color conversion layer and the low-refractive layer, and therefore leakage of light to the outside of each layer can be suppressed so that color conversion efficiency can be further improved, and good durability can be obtained. Where $n_C$ is a refractive index of the base layer, it is preferred to satisfy $n_B < n_C$. To obtain stable color conversion efficiency, it is more preferred that the difference in refractive index between the color conversion layer and the low-refractive layer satisfies $0.15 \geq n_{A1} - n_B \geq 0.05$ and $0.15 \geq n_{A2} - n_B \geq 0.05$.

The material for the low-refractive layer is not particularly limited as long as it is a resin whose refractive index satisfies $n_{A1} > n_B$ and $n_{A2} > n_B$. Specific examples thereof include known ones such as photocurable resist materials having a reactive vinyl group such as acrylic acid, methacrylic acid, vinyl polycinnamate and cyclized rubber, epoxy resins, silicone resins (including organopolysiloxane cured products (cross-linked products) such as silicone rubber and silicone gels), urea resins, fluorine resins, polycarbonate resins, acrylic resins, urethane resins, melamine resins, polyvinyl resins, polyamide resins, phenol resins, polyvinyl alcohol resins, polyvinyl butyral resins, cellulose resins, aliphatic ester resins, aromatic ester resins, aliphatic polyolefin resins, and aromatic polyolefin resins. Among them, silicone resins and fluororesins which are resins having a small refractive index are preferred, and silicone resins are more preferred from the viewpoint of improving the durability of the color conversion sheet. When the resin used for the resin layer is a silicone resin, diffusion of the light-emitting material (a) and the light-emitting material (b) into the resin layer is prevented so that it is possible to obtain a color conversion sheet which undergoes little change in chromaticity even when used for a long period of time. Examples of the silicone resin include, but are not limited to, KR-114B manufactured by Shin-Etsu Chemical Co., Ltd.

It is preferred that the color conversion layer (A), the low-refractive layer and the color conversion layer (B) are arranged in this order with the low-refractive layer being immediately adjacent to the neighboring layers. When the layers are immediately adjacent to one another, it is possible to significantly improve the color conversion efficiency of each of the color conversion layer (A) and the color conversion layer (B).

High-Refractive Layer

As described above, one example of the color conversion sheet is a color conversion sheet including a high-refractive layer as a resin layer. It is preferred that the high-refractive layer is present between the color conversion layer (A) and the color conversion layer (B). Where $n_{A1}$ is a refractive index of the color conversion layer (A), $n_{A2}$ is a refractive index of the color conversion layer (B), and $n_B$ is a refractive index of the high-refractive layer, it is necessary to satisfy $n_{A1} < n_B$ and $n_{A2} < n_B$. Since the high-refractive layer is present, light is reflected at an interface between each color conversion layer and the high-refractive layer, and therefore leakage of light to the outside of each layer can be suppressed when the low-refractive layer is present so that color conversion efficiency can be further improved, and good durability can be obtained. To obtain stable color conversion efficiency, it is more preferred that the difference in refractive index between the color conversion layer and the high-refractive layer satisfies $0.15 \geq n_B - n_{A1} \geq 0.05$ and $0.15 \geq n_B - n_{A2} \geq 0.05$.

The material for the high-refractive layer is not particularly limited as long as it is a resin whose refractive index satisfies $n_{A1} < n_B$ and $n_{A2} < n_B$, and the same material as that for the low-refractive layer can be used. In particular, an ester resin is preferably used from the viewpoint of heat resistance and durability. An example of the ester resin is "Vylon" (registered trademark) 270 manufactured by TOYOBO CO., LTD.

It is preferred that the color conversion layer (A), the high-refractive layer and the color conversion layer (B) are arranged in this order with the high-refractive layer being immediately adjacent to the neighboring layers. When the layers are immediately adjacent to one another, it is possible to significantly improve the color conversion efficiency of each of the color conversion layer (A) and the color conversion layer (B).

Light-Emitting Material

The color conversion sheet contains a light-emitting material. The light-emitting material refers to a material that emits light having a wavelength different from that of excitation light when irradiated with the excitation light. Each of the color conversion layer (A) and the color conversion layer (B) may contain one or more light-emitting materials.

The color conversion sheet may include a plurality of color conversion layers (A) and a plurality of color conversion layers (B). In this example, the compositions and forms of a plurality of color conversion layers (A) may be the same or different. Similarly, the compositions and forms of a plurality of color conversion layers (B) may be the same or different.

To achieve efficient color conversion, it is preferred that the color conversion layer contains a material having light emission characteristics with a high quantum yield. Examples of the light-emitting material include known light-emitting materials such as inorganic phosphors, fluorescent pigments, fluorescent dyes and quantum dots. Further, from the viewpoint of high light emission characteristics, it is preferred that at least one of the color conversion layer (A) and the color conversion layer (B) contains an organic light-emitting material.

An organic light-emitting material can efficiently absorb light emitted from a light source, and therefore enables enhancement of efficiency when used for the color conversion layer. Examples of the preferred organic light-emitting material include, but are not limited to, fused aryl ring-containing compounds and derivatives thereof such as naphthalene, anthracene, phenanthrene, pyrene, chrysene, naphthacene, triphenylene, perylene, fluoranthene, fluorene, and indene;
  heteroaryl ring-containing compounds and derivatives thereof such as furan, pyrrole, thiophene, silole, 9-silafluorene, 9,9'-spirobisilafluorene, benzothiophene, benzofuran, indole, di-benzothiophene, dibenzofuran, imidazopyridine, phenanthroline, pyridine, pyrazine, naphthyridine, quinoxaline, and pyrrolopyridine;
  borane derivatives;
  stilbene derivatives such as 1,4-distyrylbenzene, 4,4'-bis(2-(4-diphenylaminophenyl)eth-enyl)biphenyl, and 4,4'-bis(N-(stilben-4-yl)-N-phenylamino)stilbene;
  aromatic acetylene derivatives, tetraphenylbutadiene derivatives, aldazine derivatives, pyrromethene derivatives, and diketopyrrolo[3,4-c]pyrrole derivatives;
  coumarin derivatives such as Coumarin 6, Coumarin 7, and Coumarin 153;
  azole derivatives and metal complexes thereof such as imidazole, thiazole, thiadiazole, carbazole, oxazole, oxadiazole, and triazole;
  cyanine compounds such as indocyanine green;
  xanthene compounds and thioxanthene compounds such as fluorescein, eosin, and rhodamine;
  polyphenylene compounds, naphthalimide derivatives, phthalocyanine derivatives and metal complexes thereof, and porphyrin derivatives and metal complexes thereof;
  helicene compounds;
  aromatic amine derivatives such as N,N'-diphenyl-N,N'-di(3-methylphenyl)-4,4'-diphenyl-1,1'-diamine; and
  organometallic complex compounds of iridium (Ir), ruthenium (Ru), rhodium (Rh), palladium (Pd), platinum (Pt), osmium (Os), rhenium (Re) and the like.

The organic light-emitting material may be a fluorescence-emitting material or a phosphorescent light-emitting material, but the fluorescence-emitting material is preferred to achieve a high color purity.

Above all, a compound or its derivative having a condensed aryl ring can be suitably used from the viewpoint of high thermal stability and photostability.

Furthermore, a compound having a coordinate bond is preferred from the viewpoint of solubility and diversity of molecular structures. A compound containing boron such as a boron fluoride complex is preferred from the viewpoint of a small full width at half maximum and capability of a high-efficiency light emission.

Above all, the pyrromethene derivative can be suitably used from the viewpoint of a high fluorescent quantum yield and good durability. A compound represented by General Formula (1) is more preferred.

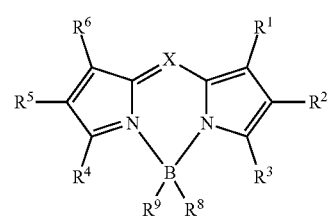

(1)

X is C—$R^7$ or N. $R^1$ to $R^9$ are the same or different, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an ester group, a carbamoyl group, an amino group, a nitro group, a silyl group, a siloxanyl group, a boryl group, a sulfo group, a phosphine oxide group, and a condensed ring and an aliphatic ring formed between adjacent substituents.

In all the above groups, the hydrogen may be deuterium. This holds true for compounds or partial structures thereof described below. In the following description, a substituted or unsubstituted $C_{6-40}$ aryl group, for example, is an aryl group all the carbon number of which is 6 to 40 including the carbon number included in a substituent by which the aryl group is substituted. This holds true for other substituents defining the carbon number.

In all the above-described groups, a substituent when they are substituted is preferably a group selected from an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an ester group, a carbamoyl group, an amino group, a nitro group, a silyl group, a siloxanyl group, a boryl group, a sulfo group and a phosphine oxide group, or further, a specific substituent described as preferred in the descriptions of the respective substituents. These substituents may be further substituted by the substituents described above.

The term "unsubstituted" in the term "substituted or unsubstituted" means that the substituent is a hydrogen atom or deuterium atom. The above holds true for examples described as "substituted or unsubstituted" in the compounds or partial structures thereof described below.

In all the above groups, the alkyl group refers to, for example, a saturated aliphatic hydrocarbon group such as a methyl group, an ethyl group, a n-propyl group, an isopropyl group, a n-butyl group, a sec-butyl group, or a tert-butyl group, and optionally has a substituent. An additional substituent when it is substituted is not limited to a particular substituent, and examples thereof include an alkyl group, halogen, an aryl group, and a heteroaryl group, which is common to the following description. The carbon number of the alkyl group, which is not limited to a particular number, is preferably 1 or more and 20 or less and more preferably 1 or more and 8 or less in view of availability and cost.

The cycloalkyl group refers to a saturated alicyclic hydrocarbon group such as a cyclopropyl group, a cyclohexyl group, a norbornyl group and an adamantyl group, and optionally has a substituent. The carbon number of the alkyl group part, which is not limited to a particular number, is preferably in the range of 3 or more and 20 or less.

The heterocyclic group refers to an aliphatic ring having an atom other than carbon within its ring such as a pyran ring, a piperidine ring, or a cyclic amide, and optionally has a substituent. The carbon number of the heterocyclic group, which is not limited to a particular number, is preferably 2 or more and 20 or less.

The alkenyl group refers to an unsaturated aliphatic hydrocarbon group containing a double bond such as a vinyl group, an allyl group, or a butadienyl group, and optionally has a substituent. The carbon number of the alkenyl group, which is not limited to a particular number, is preferably 2 or more and 20 or less.

The cycloalkenyl group refers to an unsaturated alicyclic hydrocarbon group containing a double bond such as a cyclopentenyl group, a cyclopentadienyl group and a cyclohexenyl group, and may have a substituent or may not have a substituent.

The alkynyl group refers to an unsaturated aliphatic hydrocarbon group containing a triple bond such as an ethynyl group, and may have a substituent or may not have a substituent. The carbon number of the alkynyl group, which is not limited to a particular number, is preferably 2 or more and 20 or less.

The alkoxy group refers to a functional group to which an aliphatic hydrocarbon group bonds through an ether bond such as a methoxy group, an ethoxy group, or a propoxy group, and this aliphatic hydrocarbon group optionally has a substituent. The carbon number of the alkoxy group, which is not limited to a particular number, is preferably 1 or more and 20 or less.

The alkylthio group is a group in which the oxygen atom of the ether bond of the alkoxy group is substituted by a sulfur atom. The hydrocarbon group of the alkylthio group optionally has a substituent. The carbon number of the alkylthio group, which is not limited to a particular number, is preferably 1 or more and 20 or less.

The aryl ether group refers to a function group to which an aromatic hydrocarbon group bonds through an ether bond such as a phenoxy group, and the aromatic hydrocarbon group optionally has a substituent. The carbon number of the aryl ether group, which is not limited to a particular number, is preferably 6 or more and 40 or less.

The aryl thioether group is a group in which the oxygen atom of the ether bond of the aryl ether group is substituted by a sulfur atom. The aromatic hydrocarbon group of the aryl thioether group optionally has a substituent. The carbon number of the aryl thioether group, which is not limited to a particular number, is preferably 6 or more and 40 or less.

The aryl group refers to an aromatic hydrocarbon group such as a phenyl group, a bi-phenyl group, a terphenyl group, a naphthyl group, a fluorenyl group, a benzofluorenyl group, a dibenzofluorenyl group, a phenanthryl group, an anthracenyl group, a benzophenanthryl group, a benzoanthracenyl group, a crycenyl group, a pyrenyl group, a fluoranthenyl group, a triphenylenyl group, a benzofluoranthenyl group, a dibenzoanthracenyl group, a perylenyl group, or a helicenyl group. Among them, a group selected from a phenyl group, a biphenyl group, a terphenyl group, a naphthyl group, a fluorenyl group, a phenanthryl group, an anthracenyl group, a pyrenyl group, a fluoranthenyl group and a triphenylenyl group is preferred. The aryl group optionally has a substituent. The carbon number of the aryl group, which is not limited to a particular number, is preferably 6 or more and 40 or less and more preferably 6 or more and 30 or less.

When each of $R^1$ to $R^9$ is a substituted or unsubstituted aryl group, the aryl group is preferably a group selected from a phenyl group, a biphenyl group, a terphenyl group, a naphthyl group, a fluorenyl group, a phenanthryl group and an anthracenyl group, more preferably a group selected from a phenyl group, a biphenyl group, a terphenyl group and a naphthyl group. A group selected from a phenyl group, a biphenyl group and a terphenyl group is still more preferred, with a phenyl group being particularly preferred.

When each substituent is further substituted with an aryl group, the aryl group is preferably a group selected from a phenyl group, a biphenyl group, a terphenyl group, a naphthyl group, a fluorenyl group, a phenanthryl group and an anthracenyl group, more preferably a phenyl group, a biphenyl group, a terphenyl group and a naphthyl group. particularly preferably a phenyl group.

The heteroaryl group refers to a cyclic aromatic group having one or more atoms other than carbon within its ring such as a pyridyl group, a furanyl group, a thienyl group, a quinolinyl group, an isoquinolinyl group, a pyrazinyl group, a pyrimidyl group, a pyridazinyl group, a triazinyl group, a naphthyridinyl group, a cinnolinyl group, a phthalazinyl group, a quinoxalinyl group, a quinazolinyl group, a benzofuranyl group, a benzothienyl group, an indolyl group, a dibenzofuranyl group, a dibenzothienyl group, a carbazolyl group, a benzocarbazolyl group, a carbolinyl group, an indolocarbazolyl group, a benzofurocarbazolyl group, a benzothienocarbazolyl group, a dihydroindenocarbazolyl group, a benzoquinolinyl group, an acridinyl group, a dibenzoacridinyl group, a benzimidazolyl group, an imidazopyridyl group, a benzoxazolyl group, a benzothiazolyl group, or a phenanthrolinyl group. The naphthyridinyl group refers to any of a 1,5-naphthyridinyl group, a 1,6-naphthyridinyl group, a 1,7-naphthyridinyl group, a 1,8-naphthyridinyl group, a 2,6-naphthyridinyl group, or a 2,7-naphthyridinyl group. The heteroaryl group optionally has a substituent. The carbon number of the heteroaryl group, which is not limited to a particular number, is preferably 2 or more and 40 or less and more preferably 2 or more and 30 or less.

When each of $R^1$ to $R^9$ is a substituted or unsubstituted heteroaryl group, the heteroaryl group is preferably a group selected from a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group and a phenanthrolinyl group, more preferably a group selected from a pyridyl group, a furanyl group, a thienyl group and a quinolinyl group, particularly preferably a pyridyl group.

When each substituent is further substituted with a heteroaryl group, the heteroaryl group is preferably a group selected from a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group and a phenanthrolinyl group, more preferably a group selected from a pyridyl group, a furanyl group, a thienyl group and a quinolinyl group, particularly preferably a pyridyl group.

The halogen refers to an atom selected from fluorine, chlorine, bromine, and iodine. The carbonyl group, the carboxyl group, the ester group, and the carbamoyl group optionally have a substituent. Examples of the substituent include an alkyl group, a cycloalkyl group, an aryl group, and a heteroaryl group, and these substituents may be further substituted.

The amino group is a substituted or unsubstituted amino group. Examples of the substituent when it is substituted include an aryl group, a heteroaryl group, a linear alkyl group, and a branched alkyl group. The aryl group and the heteroaryl group are each preferably a group selected from a phenyl group, a naphthyl group, a pyridyl group and a quinolinyl group. These substituents may be further substituted. The carbon number, which is not limited to a particular number, is preferably 2 or more and 50 or less, more preferably 6 or more and 40 or less, and particularly preferably 6 or more and 30 or less.

The silyl group refers to an alkyl silyl group such as a trimethylsilyl group, a triethylsilyl group, a tert-butyl dimethyl silyl group, a propyl dimethyl silyl group, or a vinyl dimethyl silyl group and an aryl silyl group such as a phenyl dimethyl silyl group, a tert-butyl diphenyl silyl group, a triphenyl silyl group, or a trinaphthyl silyl group. The substituent on the silicon may be further substituted. The carbon number of the silyl group, which is not limited to a particular number, is preferably 1 or more and 30 or less.

The siloxanyl group refers to a silicide group through an ether bond such as trimethylsiloxanyl group. The substituent on the silicon may be further substituted. The boryl group is a substituted or unsubstituted boryl group. Examples of a substituent when it is substituted include an aryl group, a heteroaryl group, a linear alkyl group, a branched alkyl group, an aryl ether group, an alkoxy group, and a hydroxy group. Among them, a group selected from an aryl group and an aryl ether group is preferred. The sulfo group is a substituted or unsubstituted sulfo group. Examples of the substituent when the sulfo group is substituted include an aryl group, a heteroaryl group, a linear alkyl group, a branched alkyl group, an aryl ether group, an alkoxy group, and a hydroxy group. Among them, a linear alkyl group or an aryl group is preferred.

The phosphine oxide group is a group represented by —P(=O)$R^{10}R^{11}$. $R^{10}$ and $R^{11}$ are each selected from a group similar to that for $R^1$ to $R^9$.

The condensed ring and the aliphatic ring formed between adjacent substituents refers to mutual bonding between any two adjacent substituents ($R^1$ and $R^2$ in General Formula (1), for example) forming a conjugated or non-conjugated cyclic skeleton. As the element of the condensed ring and the aliphatic ring, an element selected from nitrogen, oxygen, sulfur, phosphorous, and silicon, besides carbon, may be contained. The condensed ring and the aliphatic ring may further condense with another ring.

The compound represented by General Formula (1) exhibits high emission quantum yield and is small in the full width at half maximum of an emission spectrum, thus enabling both efficient color conversion and high color purity to be achieved. In addition, the compound represented by General Formula (1), by introducing an appropriate substituent to an appropriate position, enables various characteristics and properties such as emission efficiency, color purity, thermal stability, photostability, and dispersibility to be adjusted. An instance in which at least one of $R^1$, $R^3$, $R^4$, and $R^6$ is a substituted or unsubstituted alkyl group, a substituted or unsubstituted aryl group, or a substituted or unsubstituted heteroaryl group exhibits better thermal stability and photostability compared to when all $R^1$, $R^3$, $R^4$, and $R^6$ are hydrogens, for example.

When at least one of $R^1$, $R^3$, $R^4$, and $R^6$ is a substituted or unsubstituted alkyl group, the alkyl group is preferably a $C_{1-6}$ alkyl group such as a methyl group, an ethyl group, a n-propyl group, an isopropyl group, a n-butyl group, a sec-butyl group, a tert-butyl group, a pentyl group, or a hexyl group. Further, this alkyl group is preferably a group selected from a methyl group, an ethyl group, a n-propyl group, an isopropyl group, a n-butyl group, a sec-butyl group and a tert-butyl group from the viewpoint of being excellent in thermal stability. In view of preventing concentration quenching to improve fluorescence quantum yield, this alkyl group is more preferably a tert-butyl group, which is sterically bulky. In view of the easiness of synthesis and raw material availability, this alkyl group is also preferably a methyl group.

When at least one of $R^1$, $R^3$, $R^4$, and $R^6$ is a substituted or unsubstituted aryl group, the aryl group is preferably a group selected from a phenyl group, a biphenyl group, a terphenyl group and a naphthyl group, more preferably a phenyl group or a biphenyl group, particularly preferably a phenyl group.

When at least one of $R^1$, $R^3$, $R^4$, and $R^6$ is a substituted or unsubstituted heteroaryl group, the heteroaryl group is preferably a group selected from a pyridyl group, a quinolinyl group, or a thienyl group, more preferably a pyridyl group or a quinolinyl group, particularly preferably a pyridyl group.

When all $R^1$, $R^3$, $R^4$, and $R^6$ may be the same as or different from each other and are substituted or unsubstituted alkyl groups, solubility to a binder resin or a solvent is favorable, which is preferred. In this example, the alkyl group is preferably a methyl group in view of the easiness of synthesis and raw material availability.

When all $R^1$, $R^3$, $R^4$, and $R^6$, which may be the same as or different from each other, are substituted or unsubstituted aryl groups or substituted or unsubstituted heteroaryl groups, better thermal stability and photostability are exhibited, which is preferred. In this example, all $R^1$, $R^3$, $R^4$, and $R^6$, which may be the same as or different from each other, are more preferably substituted or unsubstituted aryl groups.

Although some substituents improve a plurality of properties, substituents that exhibit sufficient performance in all are limited. In particular, it is difficult to achieve both high emission efficiency and high color purity. Given these circumstances, a plurality of kinds of substituents are introduced to the compound represented by General Formula (1), whereby a compound having a balance among emission characteristics, high color purity and the like can be obtained.

In particular, $R^1$, $R^3$, $R^4$ and $R^6$ may all be the same or different, and when R', $R^3$, $R^4$ and $R^6$ are a substituted or unsubstituted aryl group, it is preferred to introduce plural types of substituents, e.g., in $R^1 \neq R^4$, $R^3 \neq R^6$, $R^1 \neq R^3$, $R^4 \neq R^6$ or the like. "Not equal to" means that they are groups having different structures. $R^1 \neq R^4$ means that $R^1$ and $R^4$ are groups having different structures, for example. A plurality of kinds of substituents are introduced as described above, whereby an aryl group that has an influence on color purity and an aryl group that has an influence on emission efficiency can be simultaneously introduced, and fine adjustment can be made.

Among them, $R^1 \neq R^3$ or $R^4 \neq R^6$ is preferred in view of improving emission efficiency and color purity with a good balance. In this example, to the compound represented by General Formula (1), one or more aryl groups having an influence on color purity can be introduced to both pyrrole rings each, whereas an aryl group having an influence on emission efficiency can be introduced to any other position, and both of these properties can be improved to the maximum. In addition, when $R^1 \neq R^3$ or $R^4 \neq R^6$, in view of improving both heat resistance and color purity, more preferred are $R^1 = R^6$ and $R^3 = R^4$.

The aryl group that has an influence on color purity is preferably an aryl group substituted by an electron donating group. The electron donating group is an atomic group that donates an electron to a substituted atomic group by the inductive effect and/or the resonance effect in the organic electron theory. Examples of the electron donating group include ones having a negative value as a substituent constant (σp (para)) of Hammett's Rule. The substituent constant (σp (para)) of Hammett's Rule can be cited from Kagaku Binran Kiso-Hen Revised 5th Edition (II, p. 380).

Specific examples of the electron donating group include an alkyl group (σp of a methyl group: –0.17), an alkoxy group (σp of a methoxy group=–0.27), and an amino group (σp of —$NH_2$=–0.66). In particular, a $C_{1-8}$ alkyl group or a $C_{1-8}$ alkoxy group is preferred, and a group selected from a methyl group, an ethyl group, a tert-butyl group and a methoxy group is more preferred. In view of dispersibility, a tert-butyl group or a methoxy group is particularly preferred; when these substituents are the electron donating group, quenching caused by the aggregation of molecules can be prevented in the compound represented by General Formula (1). Although the substitution position of the substituent is not limited to a particular position, the substituent is preferably bonded to the meta position or the para position relative to the position bonding to the pyrromethene skeleton, because the twist of bonding is required to be inhibited to increase the photostability of the compound represented by General Formula (1). Meanwhile, the aryl group that has an influence mainly on emission efficiency is preferably an aryl group having a bulky substituent such as a tert-butyl group, an adamantyl group, or a methoxy group.

When $R^1$, $R^3$, $R^4$, and $R^6$, which may be the same as or different from each other, are substituted or unsubstituted aryl groups, $R^1$, $R^3$, $R^4$, and $R^6$, which may be the same as or different from each other, are preferably substituted or unsubstituted phenyl groups. In this example, $R^1$, $R^3$, $R^4$, and $R^6$ are each more preferably selected from the following Ar-1 to Ar-6. In this example, the combination of $R^1$, $R^3$, $R^4$, and $R^6$ is not particularly limited.

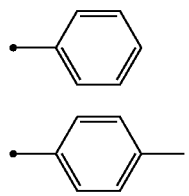
Ar-1

Ar-2

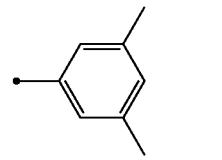
Ar-3

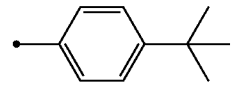
Ar-4

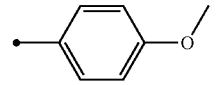
Ar-5

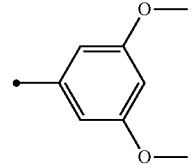
Ar-6

$R^2$ and $R^5$ are each preferably any of hydrogen, an alkyl group, a carbonyl group, an ester group, and an aryl group. Among them, hydrogen and an alkyl group are preferred in view of thermal stability, and hydrogen is more preferred in view of the easiness of obtaining a narrow full width at half maximum in an emission spectrum.

$R^8$ and $R^9$ are preferably a group selected from an alkyl group, an aryl group, a heteroaryl group, an alkoxy group, an aryl ether group, fluorine, a fluorine-containing alkyl group, a fluorine-containing heteroaryl group or a fluorine-containing aryl group, a fluorine-containing alkoxy group, a fluorine-containing aryl ether group and a cyano group, and more preferably fluorine, a cyano group or a fluorine-containing aryl group it is stable against excitation light, and a higher fluorescent quantum yield is obtained. Fluorine or a cyano group is more preferred because of easy synthesis. Further, any one of $R^8$ and $R^9$ is preferably a cyano group. Durability is improved by introducing a cyano group.

The fluorine-containing aryl group is an aryl group containing fluorine; examples thereof include a fluorophenyl group, a trifluoromethylphenyl group, and pentafluorophenyl group. The fluorine-containing heteroaryl group is a heteroaryl group containing fluorine; examples thereof include a fluoropyridyl group, a trifluoromethylpyridyl group, and trifluoropyridyl group. The fluorine-containing alkyl group is an alkyl group containing fluorine; examples thereof include a trifluoromethyl group and a pentafluoroethyl group.

In General Formula (1), X is preferably C—$R^7$ in view of photostability. When X is C—$R^7$, the substituent $R^7$ has a great influence on the durability of the compound represented by General Formula (1), that is, a temporal reduction in the emission intensity of this compound. Specifically, when IC is hydrogen, the reactivity of this part is high, and this part and water and oxygen in the air easily react with each other. This phenomenon causes the decomposition of the compound represented by General Formula (1). When IC is a substituent having a large degree of freedom of the motion of a molecular chain such as an alkyl group, although the reactivity indeed reduces, the compounds flocculate with the lapse of time in the color conversion layer, resulting in a decrease in emission intensity caused by concentration quenching. Thus, IC is preferably a group that is rigid, is small in the degree of freedom of motion, and is difficult to cause aggregation, and specifically preferably any of a substituted or unsubstituted aryl group and a substituted or unsubstituted heteroaryl group.

From the viewpoints of giving higher fluorescence quantum yield, being more resistant to thermal decomposition, and photostability, X is preferably C—$R^7$ in which IC is a substituted or unsubstituted aryl group. The aryl group is preferably a group selected from a phenyl group, a biphenyl group, a terphenyl group, a naphthyl group, a fluorenyl group, a phenanthryl group and an anthracenyl group because the emission wavelength is not impaired.

Further, to enhance the photostability of the compound represented by General Formula (1), the twist of the carbon-carbon bond between IC and the pyrromethene skeleton is required to be appropriately reduced, because an excessively large twist causes a reduction in photostability such as an increase in reactivity against the excitation light. Given these circumstances, IC is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, and particularly preferably a substituted or unsubstituted phenyl group.

$R^7$ is preferably a moderately bulky substituent. When $R^7$ is moderately bulky, the aggregation of molecules can be prevented. Consequently, the emission efficiency and durability of the compound represented by General Formula (1) further improve.

A further preferred example of the bulky substituent is the structure of $R^7$ represented by General Formula (2).

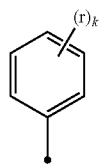

(2)

In General Formula (2), r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, a halogen, a cyano group, an aldehyde group, a carbonyl group, a carboxy group, an ester group, a carbamoyl group, an amino group, a nitro group, a silyl group, a siloxanyl group, a boryl group, a sulfo and a phosphine oxide group. k is an integer of 1 to 3; When k represents 2 or larger, each r may be the same or different.

In view of the capability of giving higher emission quantum yield, r is preferably a substituted or unsubstituted aryl group. Preferred examples of the aryl group include a phenyl group or a naphthyl group in particular. When r is an aryl group, k in General Formula (2) is preferably 1 or 2 and more preferably 2 in view of preventing the aggregation of molecules. In addition, when k is 2 or more, at least one of rs is preferably substituted by an alkyl group. Particularly preferred examples of the alkyl group include a group selected from a methyl group, an ethyl group and a tert-butyl group from the viewpoint of thermal stability.

From the viewpoint of controlling the fluorescence wavelength and the absorption wavelength and enhancing compatibility with a solvent, r is preferably a substituted or unsubstituted alkyl group, a substituted or unsubstituted alkoxy group, or halogen, more preferably a group selected from a methyl group, an ethyl group, a tert-butyl group and a methoxy group. In view of dispersibility, a tert-butyl group or a methoxy group is particularly preferred. The fact that r is a tert-butyl group or a methoxy group is more effective for the prevention of quenching caused by the aggregation of molecules.

As another mode of the compound represented by General Formula (1), at least one of $R^1$ to $R^7$ is preferably an electron withdrawing group. In particular, preferred is (1) at least one of $R^1$ to $R^6$ being an electron withdrawing group, (2) $R^7$ being an electron withdrawing group, or (3) at least one of $R^1$ to $R^6$ being an electron withdrawing group and $R^7$ being an electron withdrawing group. The electron withdrawing group is thus introduced to the pyrromethene skeleton of the compound, whereby the electron density of the pyrromethene skeleton can be greatly reduced. With this reduction in electron density, the stability of the compound against oxygen further improves, and consequently, the durability of the compound can be further improved.

The electron withdrawing group is called also an electron accepting group and is an atomic group that attracts an electron from a substituted atomic group by the inductive effect and/or the resonance effect in the organic electron theory. Examples of the electron withdrawing group include ones having a positive value as a substituent constant (σp (para)) of Hammett's Rule. The substituent constant (σp (para)) of Hammett's Rule can be cited from Kagaku Binran Kiso-Hen Revised 5th Edition (II, p. 380). Although the phenyl group has an example taking a positive value as in the above, the electron withdrawing group does not include the phenyl group.

Examples of the electron withdrawing group include —F (σp: +0.06), —Cl (σp: +0.23), —Br (σp: +0.23), —I (σp: +0.18), —$CO_2R^{12}$ (σp: +0.45 when $R^{12}$ is an ethyl group), —$CONH_2$ (σp: +0.38), —$COR^{12}$ (σp: +0.49 when $R^{12}$ is a methyl group), —$CF_3$ (σp: +0.50), —$SO_2R^{12}$ (σp: +0.69 when $R^{12}$ is a methyl group), and —$NO_2$ (σp: +0.81). $R^{12}$s each independently represent a hydrogen atom, a substituted or unsubstituted aromatic hydrocarbon group with a ring-forming carbon number of 6 o 30, a substituted or unsubstituted heterocyclic group with a ring-forming carbon number of 5 o 30, a substituted or unsubstituted $C_{1-30}$ alkyl group, or a substituted or unsubstituted $C_{1-30}$ cycloalkyl group. Specific examples of these groups include examples similar to those described above.

In General Formula (1), at least one of $R^2$ and $R^5$ is preferably an electron withdrawing group. This is because $R^2$ and $R^5$ in General Formula (1) are substitution positions that have a significant effect on the electron density of the pyrromethene skeleton, and when an electron withdrawing group is introduced to $R^2$ and $R^5$, the electron density of the pyrromethene skeleton can be efficiently reduced, and thus stability to oxygen is further improved so that it is possible to further improve durability.

Further, in General Formula (1), each of $R^2$ and $R^5$ is more preferably an electron withdrawing group. This is because the stability of the compound of General Formula (1) against oxygen is further improved so that it is possible to significantly improve durability.

The electron withdrawing group is preferably a group containing a fluorine atom. When the electron withdrawing group is a group containing a fluorine atom, the electron density of the pyrromethene skeleton can be further reduced, and thus the stability of the compound of General Formula (1) against oxygen is improved so that it is possible to significantly improve durability.

Examples of the preferred electron withdrawing group include fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, a substituted or unsubstituted sulfonic acid ester group, a substituted or unsubstituted sulfonamide group, and a cyano group. This is because they are resistant to chemical decomposition.

Examples of the more preferred electron withdrawing group include a fluorine-containing alkyl group, a substituted or unsubstituted acyl group, a substituted or unsubstituted ester group, a substituted or unsubstituted amide group, a substituted or unsubstituted sulfonyl group, a substituted or unsubstituted sulfonic acid ester group, a substituted or unsubstituted sulfonamide group, and a cyano group. this is because they prevent concentration quenching, leading to an effect of improving emission quantum yield. A particularly preferred electron withdrawing group is a substituted or unsubstituted ester group.

More preferable examples of the electron withdrawing group include a fluorine-containing acyl group, a fluorine-containing ester group, a fluorine-containing amide group, a fluorine-containing sulfonyl group, a fluorine-containing sulfonic acid ester group, and a fluorine-containing sulfonamide group. These groups can efficiently reduce the electron density of the pyrromethene boron complex skeleton. This improves the stability of the compound of General Formula (1) against oxygen, and as a result, it is possible to further improve durability.

In particular, it is preferred that at least one of $R^2$ and $R^5$, which may be the same or different, is a substituted or unsubstituted ester group because durability can be improved without deteriorating the color purity. In particular, it is particularly preferred that both of $R^2$ and $R^5$, which may be the same or different, are substituted or unsubstituted ester groups from the viewpoint of durability.

Preferred examples of the compound represented by General Formula (1) include compounds in which all of $R^1$, $R^3$, $R^4$ and $R^6$, which may be the same or different, are substituted or unsubstituted alkyl groups, X is C—$R^7$, and $R^7$ is a group represented by General Formula (2). In this example, r in $R^7$ is particularly preferably a substituted or unsubstituted phenyl group.

Another preferred example of the compound represented by General Formula (1) is a compound in which all of $R^1$, $R^3$, $R^4$ and $R^6$, which may be the same or different, are each selected from Ar-1 to Ar-6 described above, X is C—$R^7$, and $R^7$ is the group represented by General Formula (2). In this example, r in $R^7$ is more preferably a tert-butyl group or a methoxy group, and r is particularly preferably a methoxy group.

Another preferred example of the compound represented by General Formula (1) is a compound in which all of $R^1$, $R^3$, $R^4$ and $R^6$, which may be the same or different, are substituted or unsubstituted alkyl groups, $R^1$ and $R^5$, which may be the same or different, are substituted or unsubstituted ester groups, X is C—$R^7$, and $R^7$ is a group represented by General Formula (2). In this example, r in $R^7$ is particularly preferably a substituted or unsubstituted phenyl group.

Another preferred example of the compound represented by General Formula (1) is a compound in which all of $R^1$, $R^3$, $R^4$ and $R^6$, which may be the same or different, are each selected from Ar-1 to Ar-6 described above, $R^1$ and $R^5$, which may be the same or different, are substituted or unsubstituted ester groups, X is C—$R^7$, and $R^7$ is a group represented by General Formula (2). In this example, r in $R^7$ is more preferably a tert-butyl group or a methoxy group, and r is particularly preferably a methoxy group.

The following shows examples of the compound represented by General Formula (1). This compound is not, however, limited to these examples.

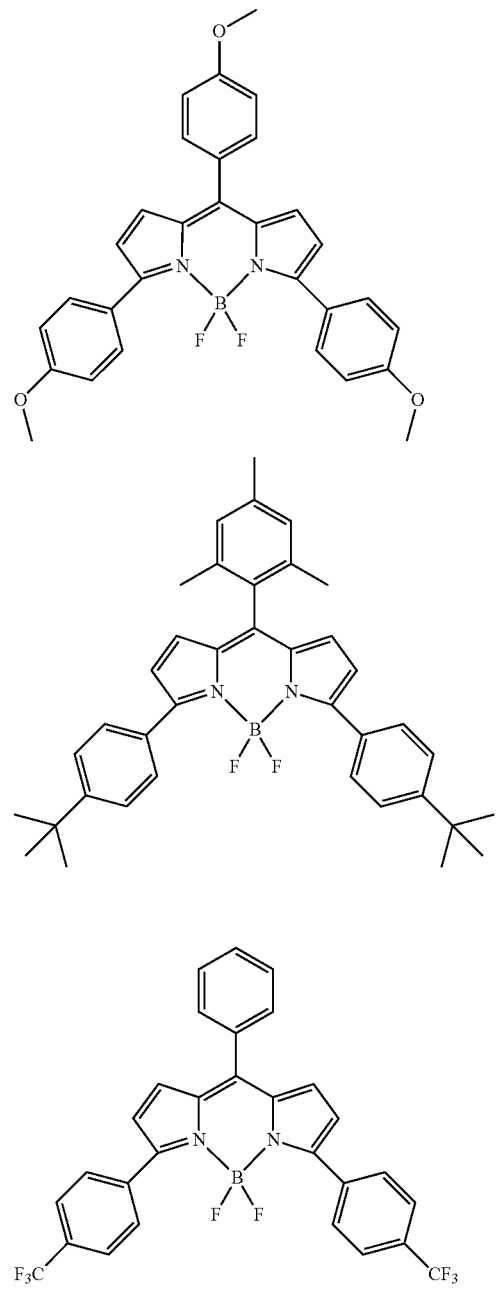

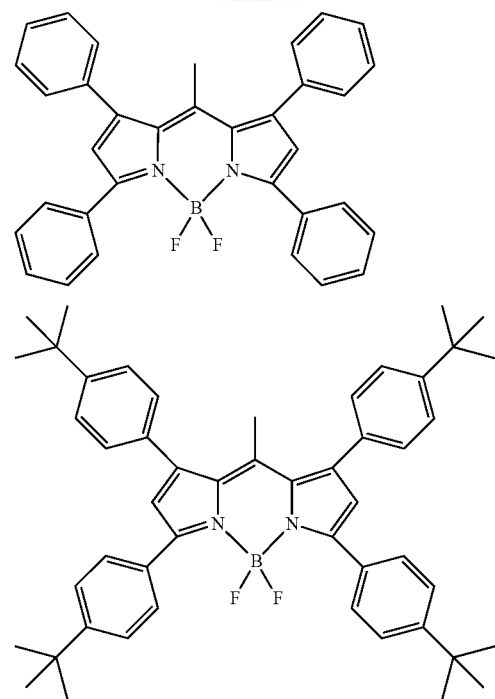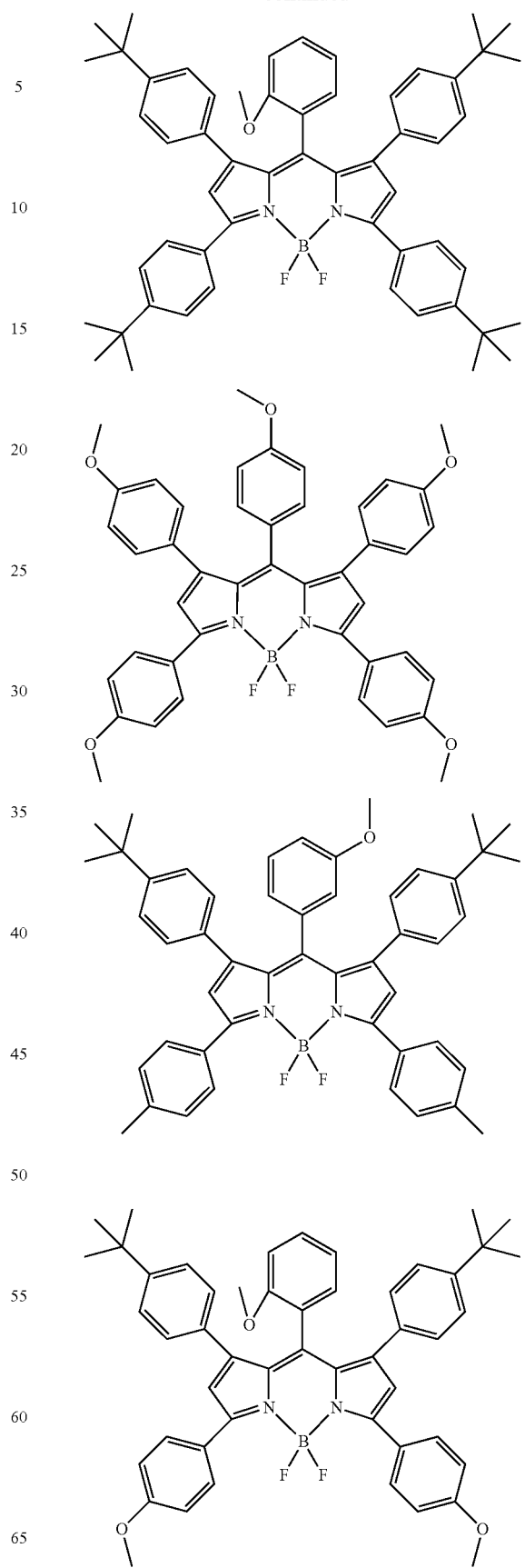

-continued
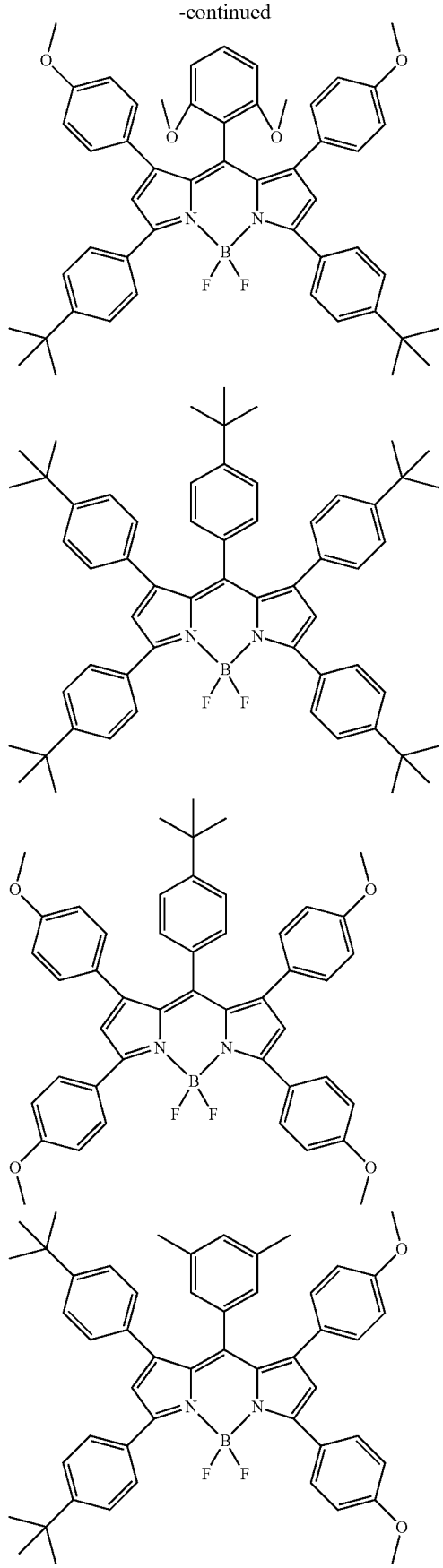
-continued
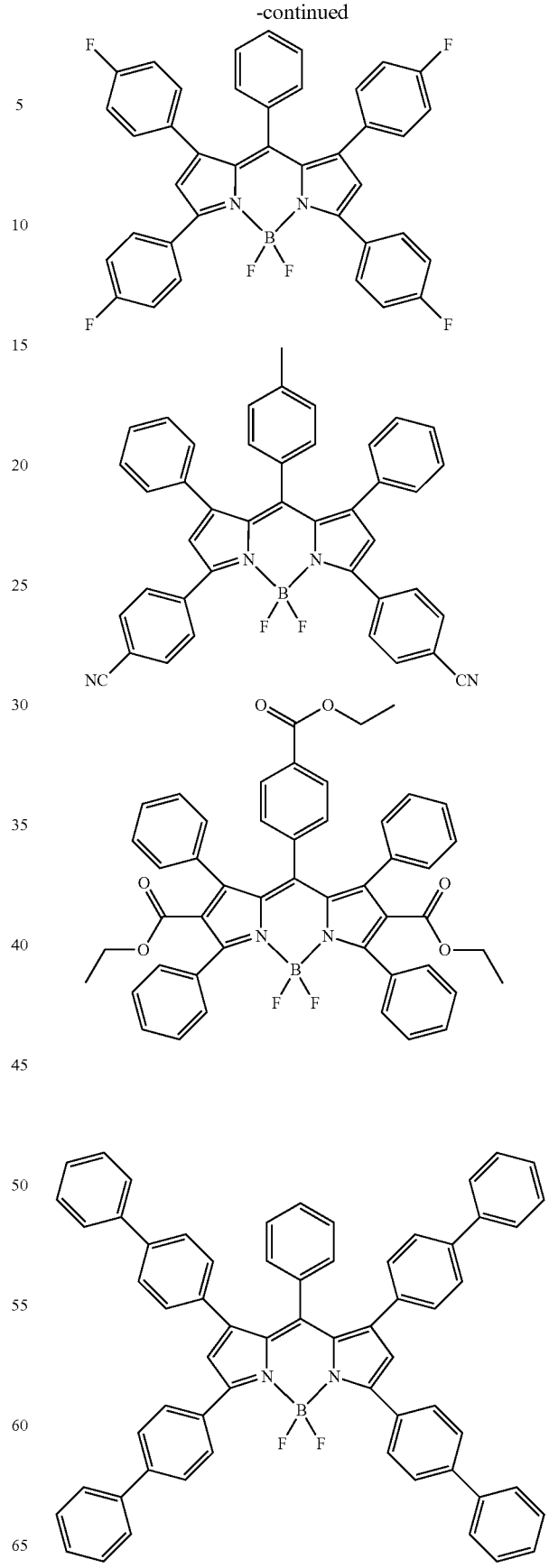

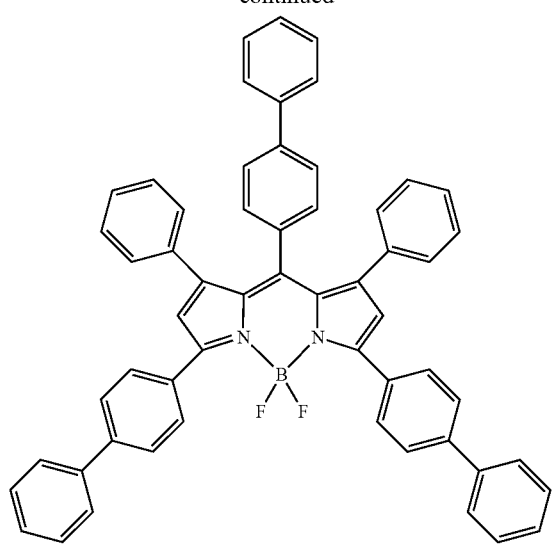
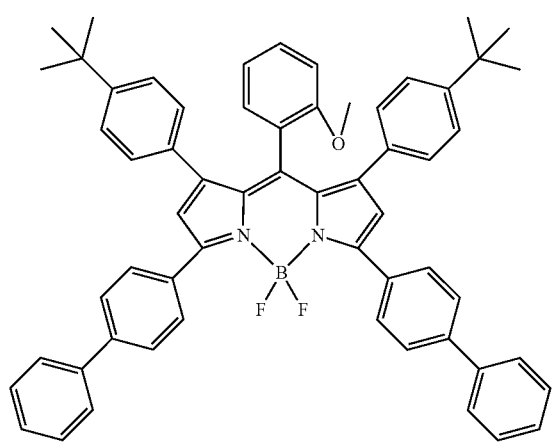
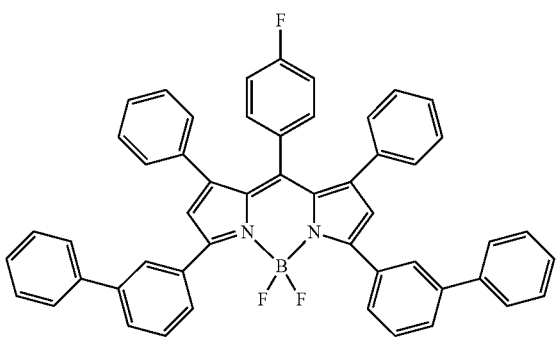
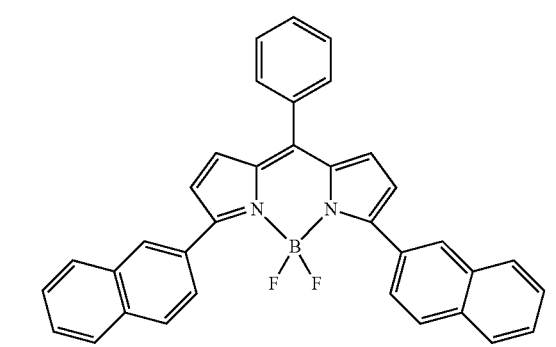
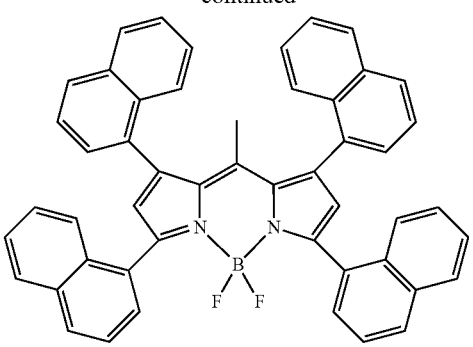
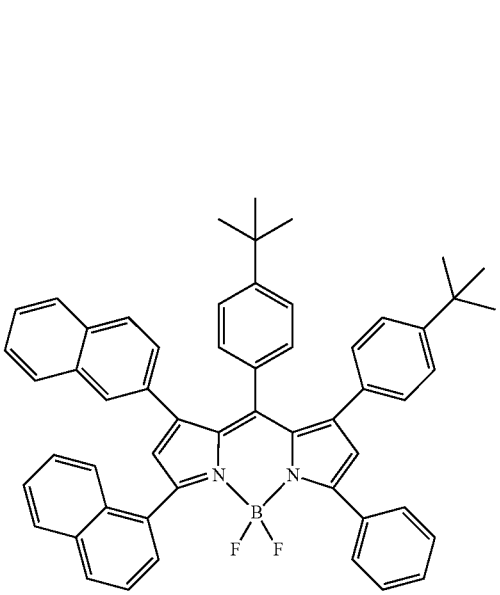
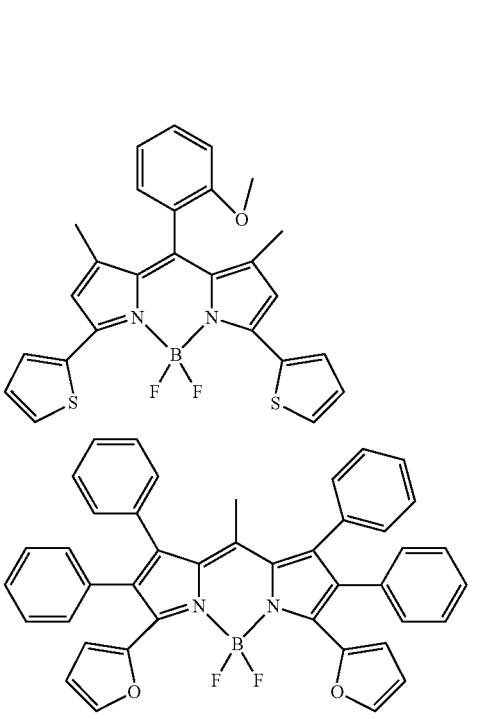

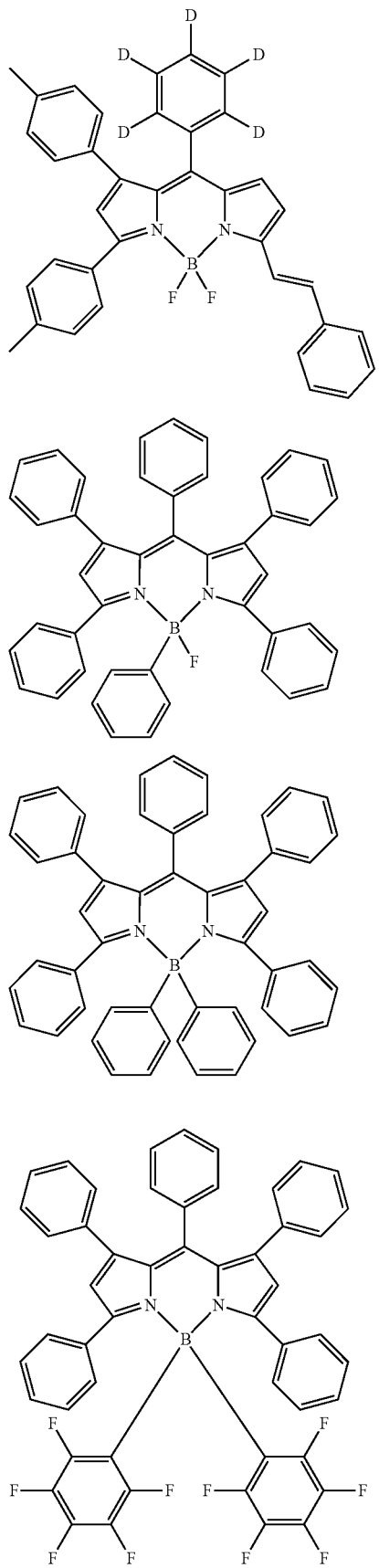
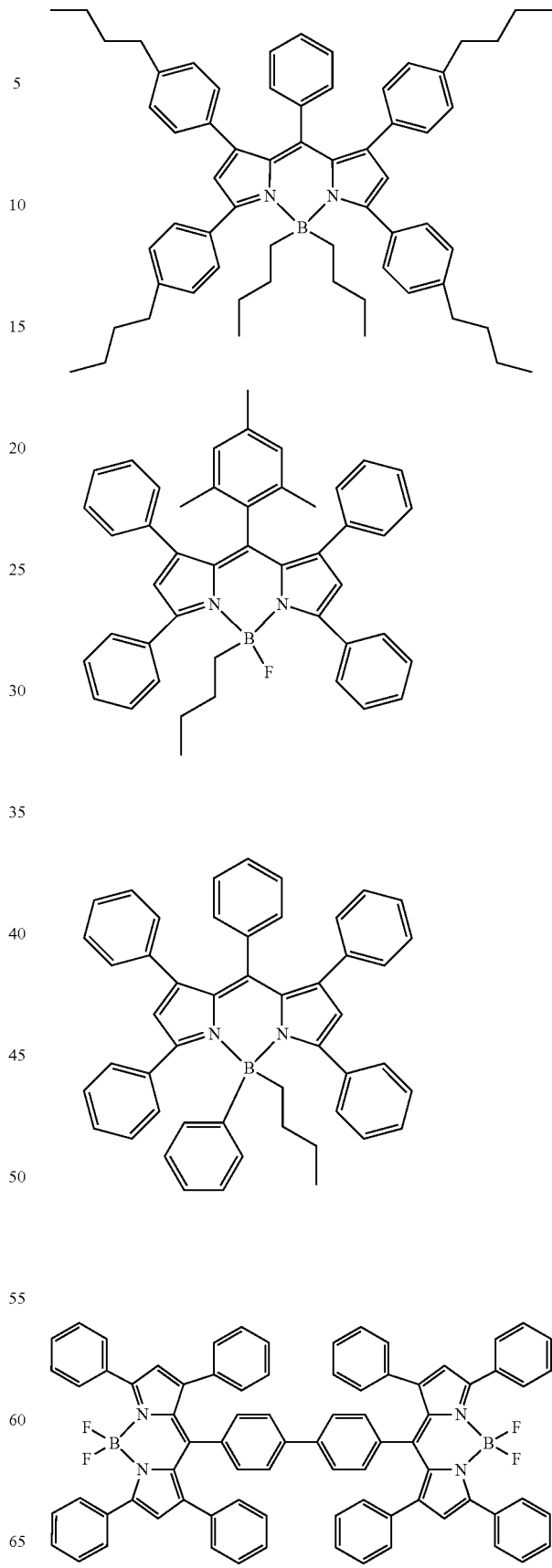

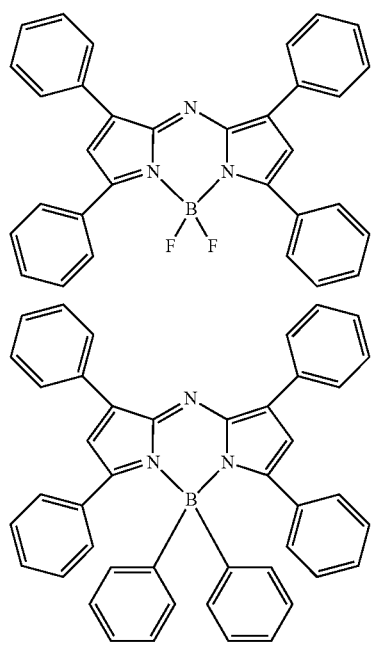
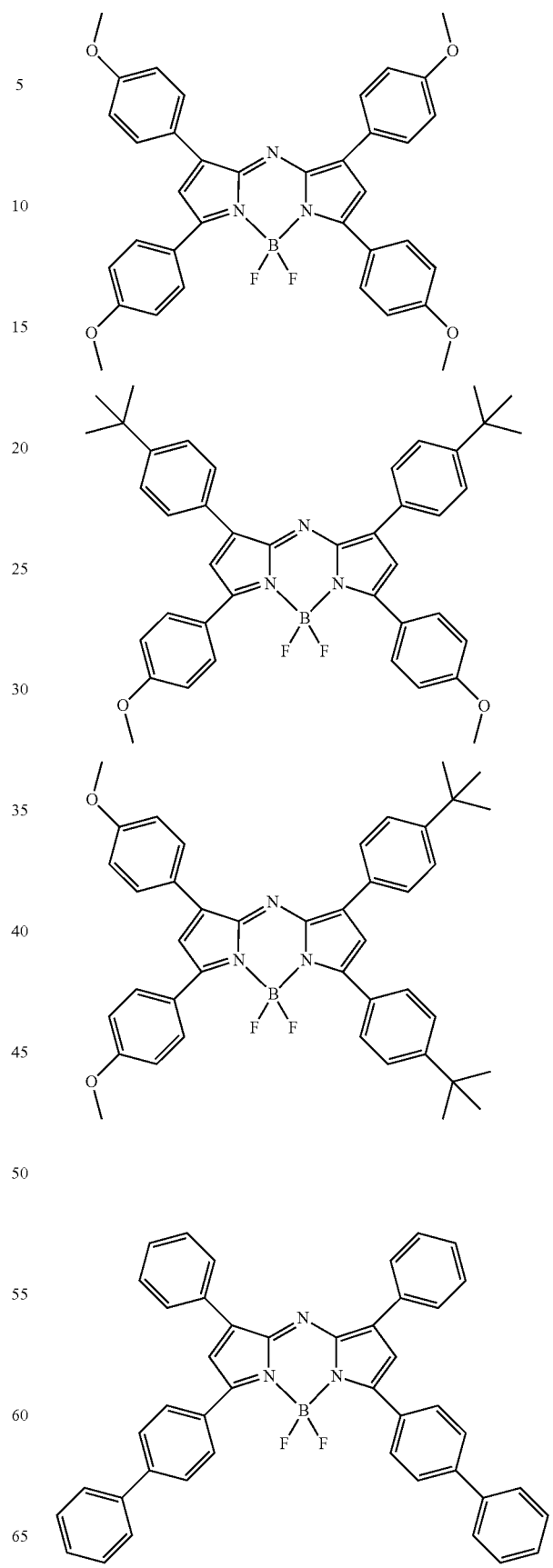

31
-continued
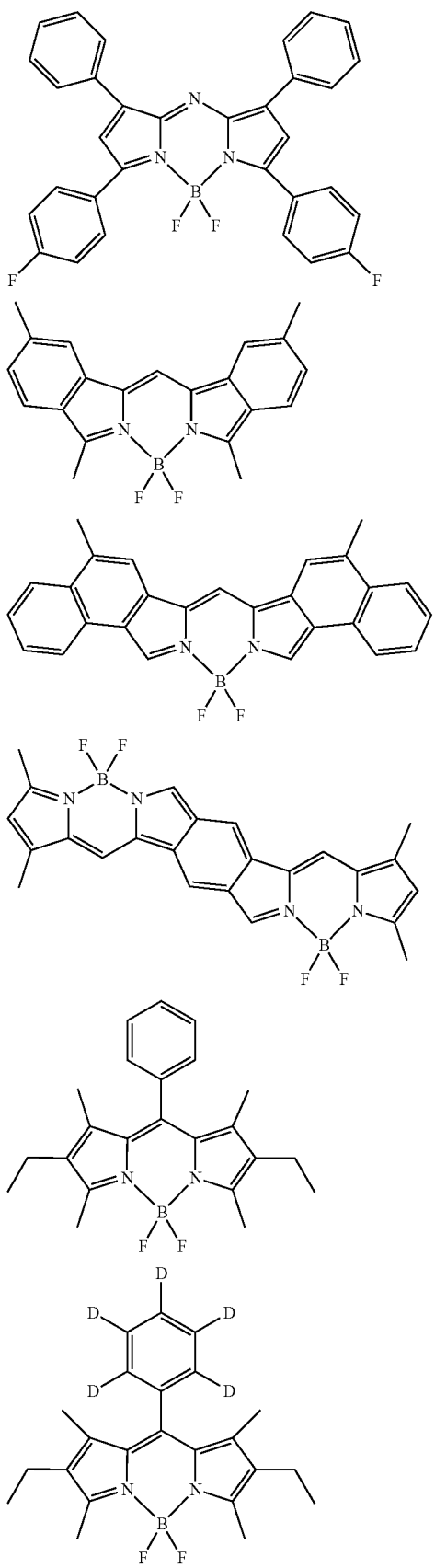
32
-continued
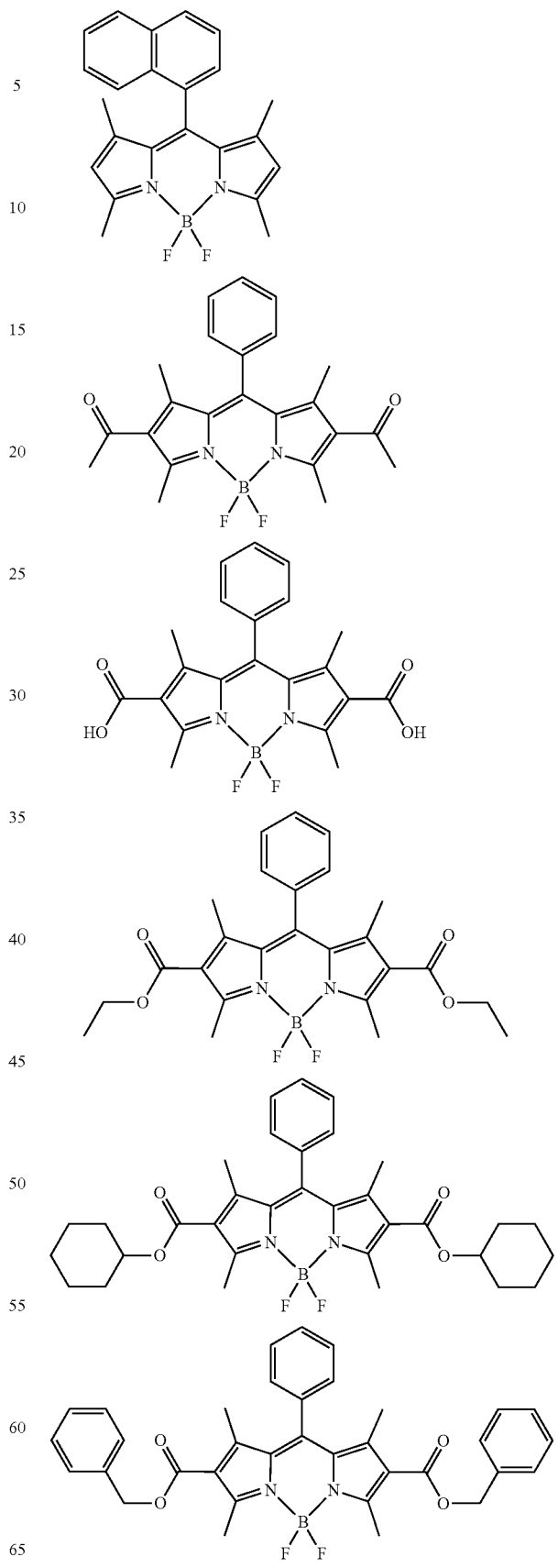

33
-continued
34
-continued
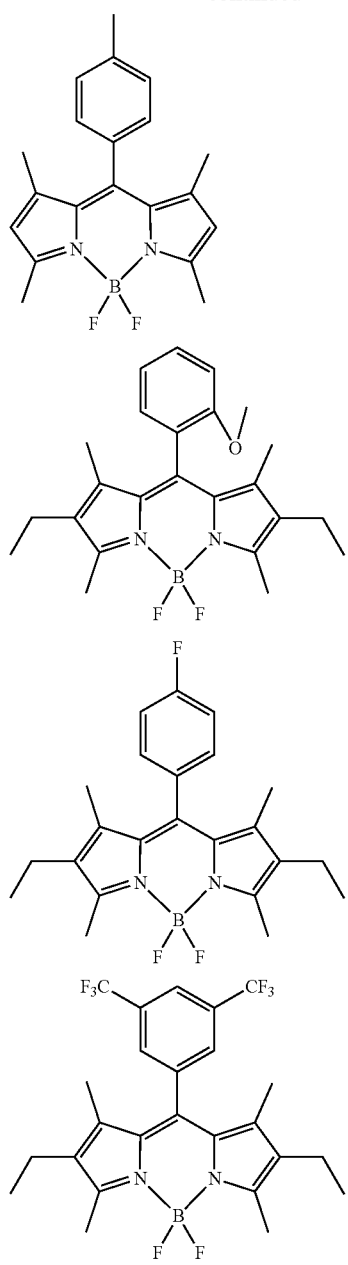
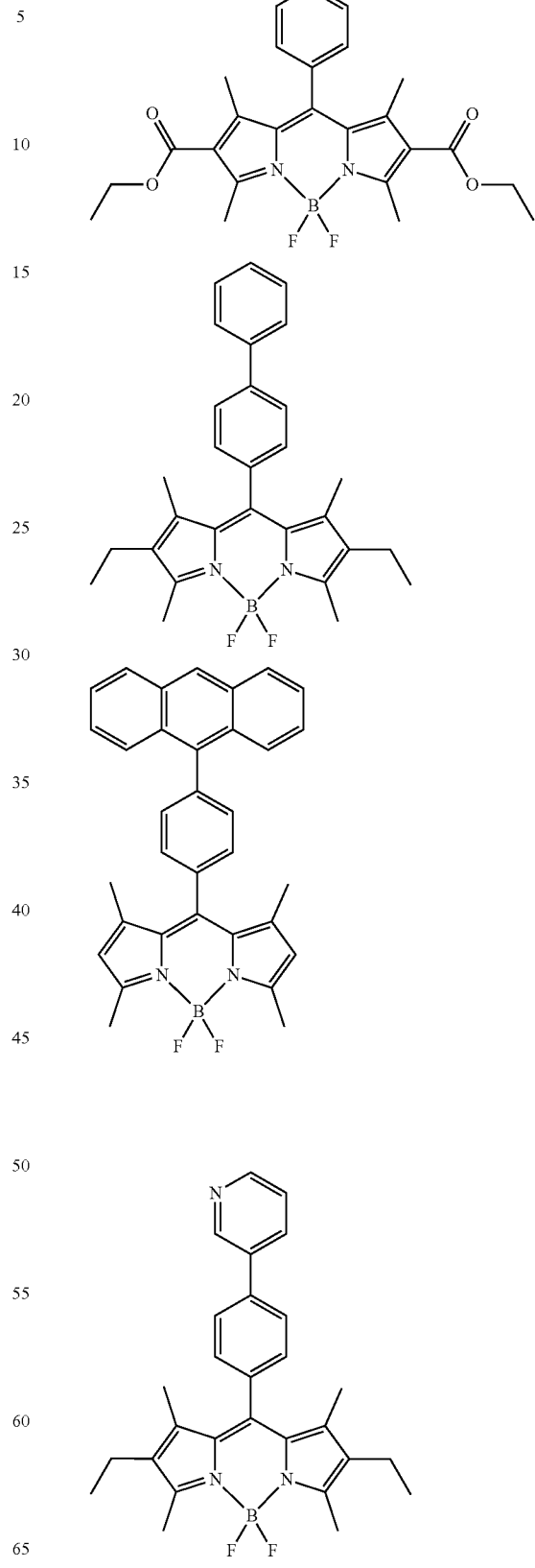

35
-continued
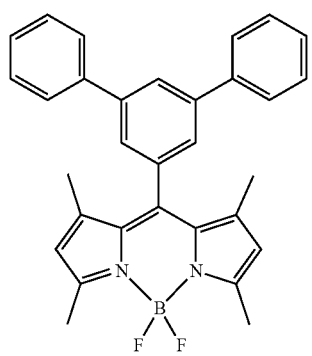
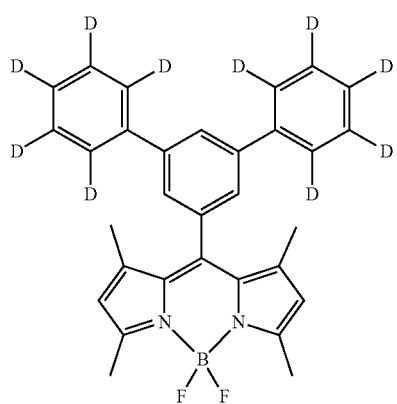
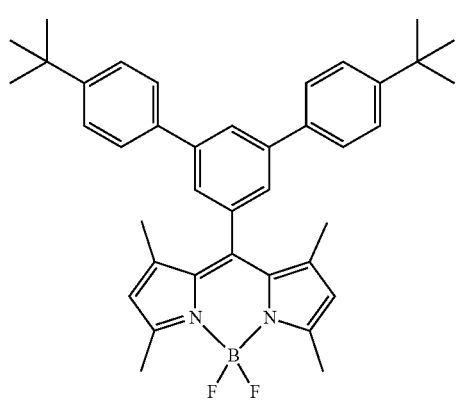
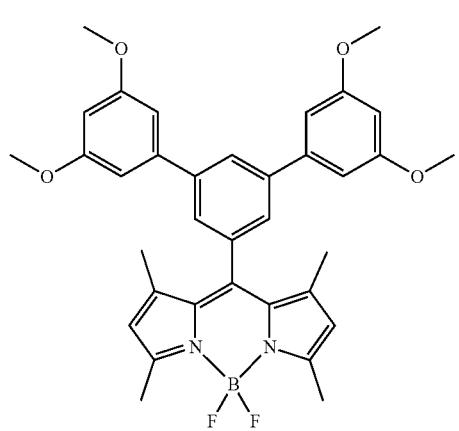
36
-continued
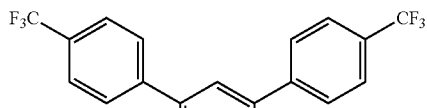
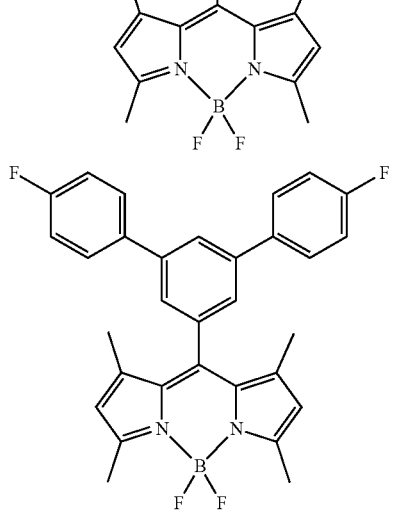
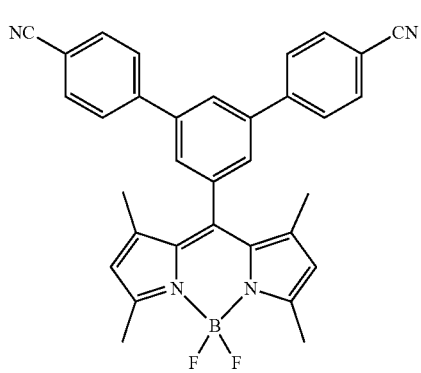
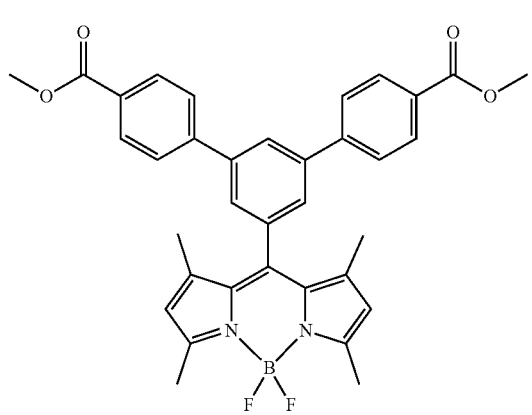

-continued

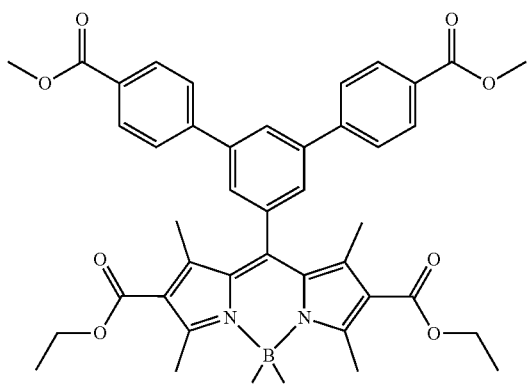

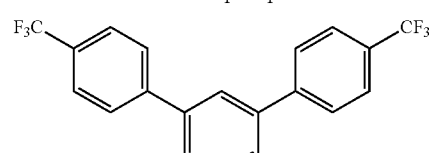

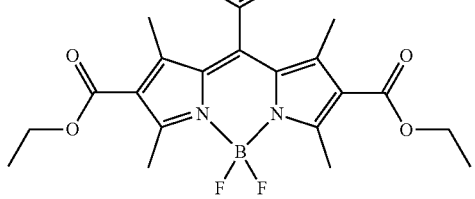

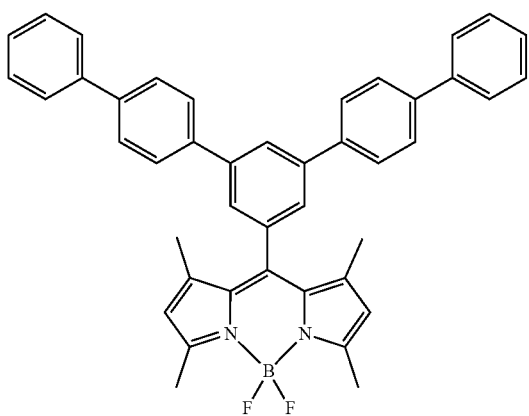

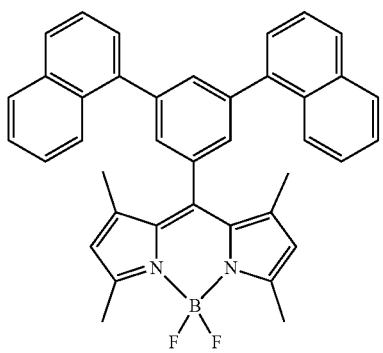

The compound represented by General Formula (1) can be synthesized by a method described in Japanese Translation of PCT Application No. H08-509471 and Japanese Patent Application Laid-open No. 2000-208262, for example. That is, a pyrromethene compound and a metal salt are reacted with each other in the presence of a base to obtain a target pyrromethene-based metal complex.

For the synthesis of a pyrromethene-boron fluoride complex, methods described in J. Org. Chem., vol. 64, No. 21, pp. 7813-7819 (1999), Angew. Chem., Int. Ed. Engl., vol. 36, pp. 1333-1335 (1997), and the like are referred to, whereby the compound represented by General Formula (1) can be synthesized. Examples of the methods include a method that heats a compound represented by General Formula (3) and a compound represented by General Formula (4) in 1,2-dichloroethane in the presence of phosphoryl chloride and reacts them with a compound represented by General Formula (5) in 1,2-dichloroethane in the presence of triethylamine, thereby obtaining the compound represented by General Formula (1). However, this disclosure is not limited to this method. $R^1$ to $R^9$ are similar to those described above. J represents halogen.

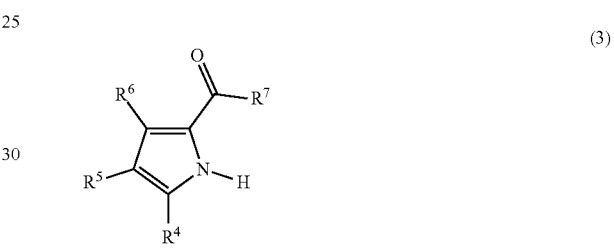

(3)

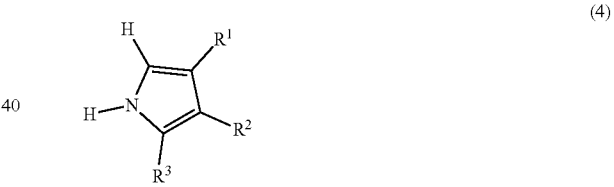

(4)

(5)

In addition, in introducing an aryl group or a heteroaryl group, there is a method that forms a carbon-carbon bond using a coupling reaction between a halogenated derivative and boronic acid or an esterified boronic acid derivative; this disclosure is not limited to this method. Similarly, in introducing an amino group or a carbazolyl group, there is a method that forms a carbon-nitrogen bond using a coupling reaction between a halogenated derivative and an amine or a carbazole derivate in the presence of a metallic catalyst such as palladium, for example. This disclosure is not limited to this method.

The color conversion layer according to an example can contain other compounds as appropriate as needed, in addition to the compound represented by General Formula (1). For example, to further enhance energy transfer efficiency to the compound of General Formula (1) from the excitation light, assist dopants such as rubrene may be contained. When any light emission color other than the light emission color of the compound represented by General Formula (1) is desired to be added, the color conversion composition can add desired organic light-emitting materials including organic light-emitting materials such as coumarin-based dyes and rhodamine-based dyes. Besides these organic light-emitting materials, known light-emitting materials such as inorganic phosphors, fluorescent pigments, fluorescent dyes, quantum dots, and delayed fluorescence can be added in combination.

The following shows examples of the organic light-emitting material other than the compound represented by General Formula (1). This disclosure is not limited particularly to these examples.

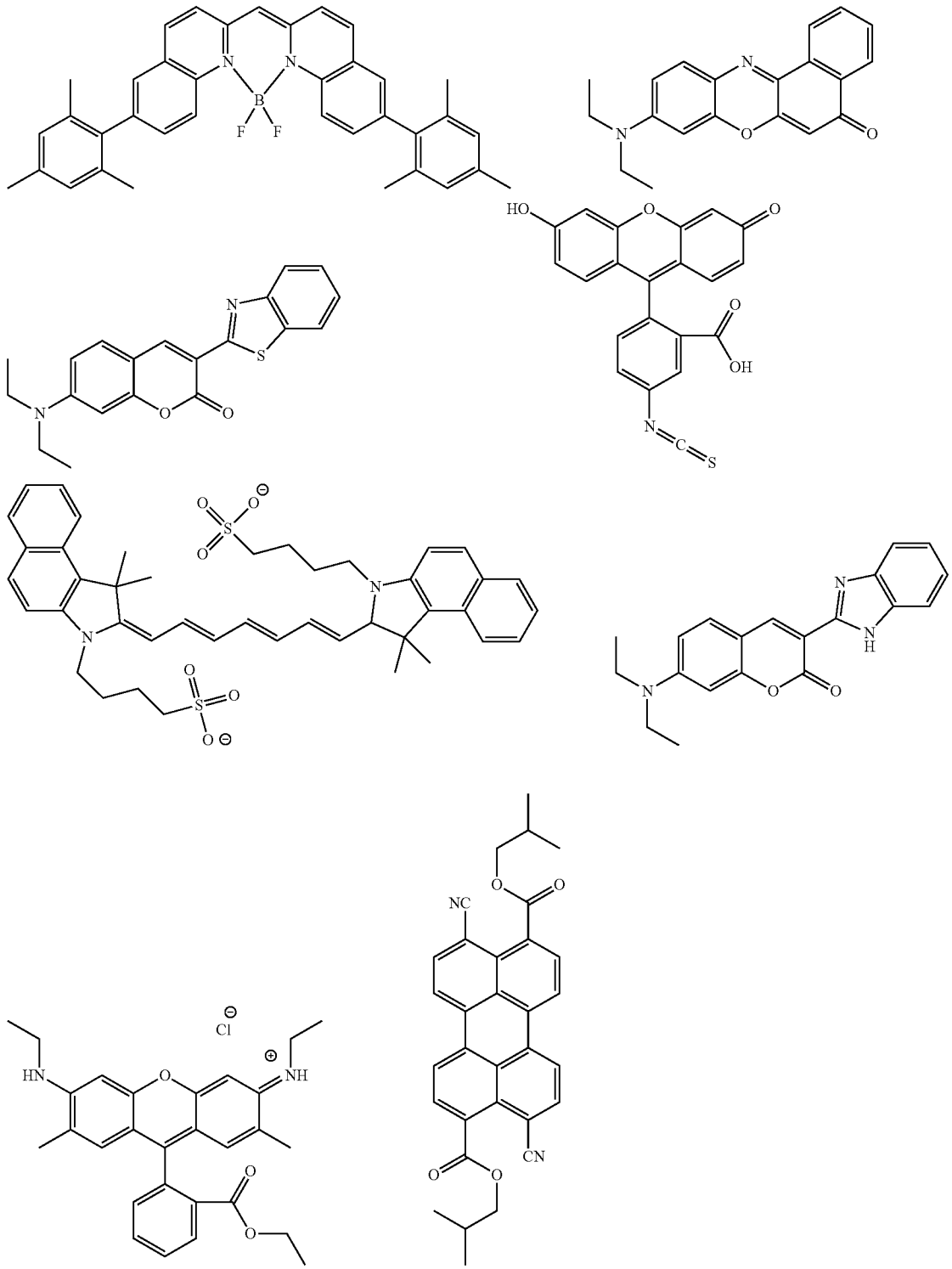

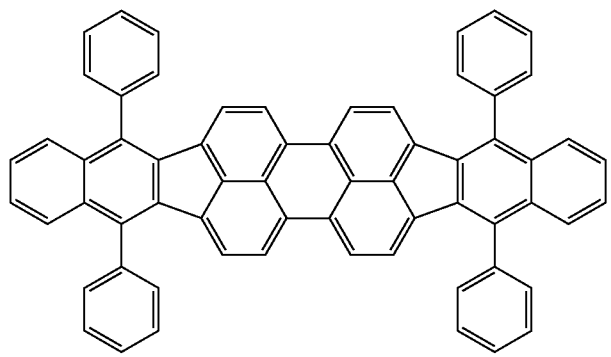
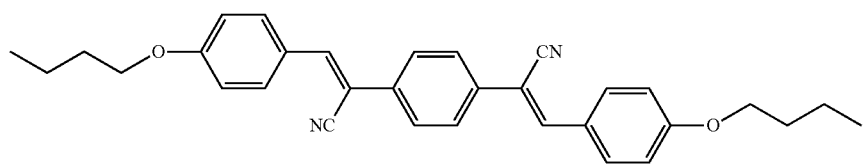
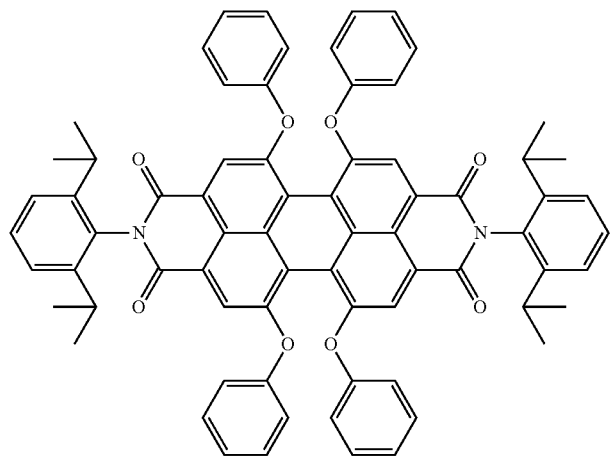
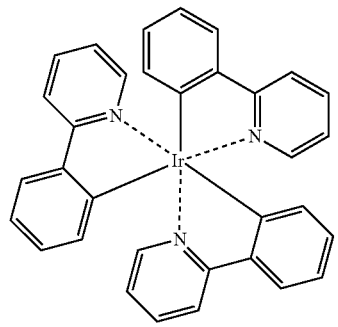
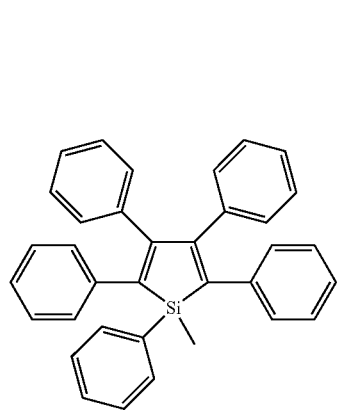
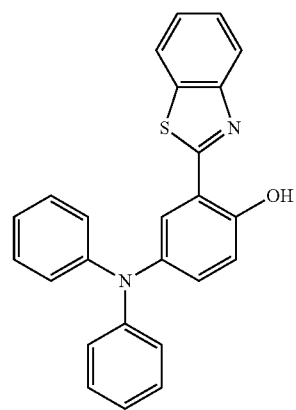
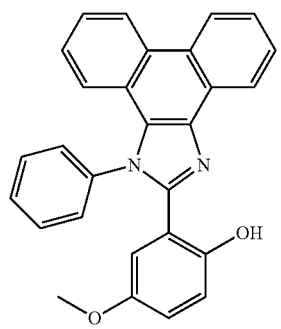

-continued

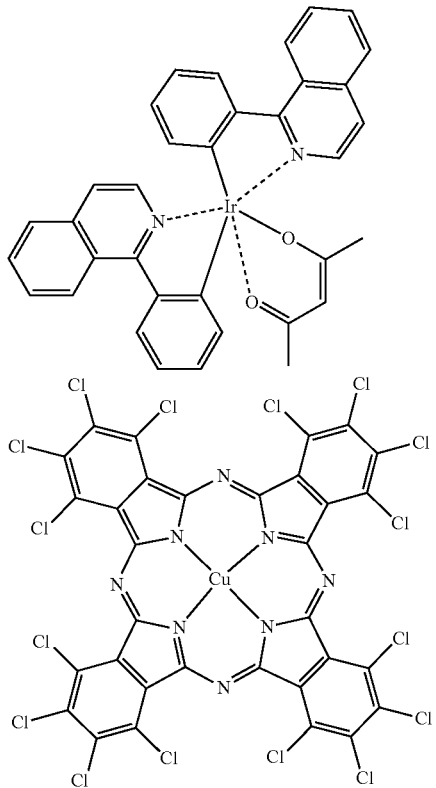

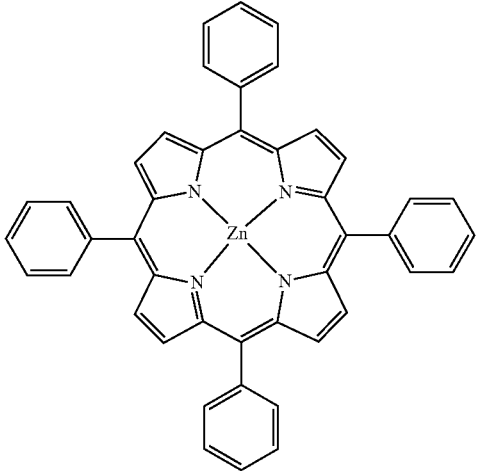

Examples of the inorganic phosphor include green phosphors such as $SrAl_2O_4$:Eu, $Y_2SiO_5$:Ce,Tb, $MgAl_{11}O_{19}$:Ce, Tb, $Sr_7Al_{12}O_{25}$:Eu, $MgGa_2S_4$:Eu, $CaGa_2S_4$:Eu, $SrGa_2S_4$:Eu and $BaGa_2S_4$:Eu; blue phosphors such as $Sr_5(PO_4)_3Cl$:Eu, $(SrCaBa)_5(PO_4)_3Cl$:Eu, $(BaCa)_5(PO_4)_3Cl$:Eu, $B_5O_9Cl$:Eu, Mn, $Mg(PO_4)_6Cl_2$:Eu,Mn, $Ca(PO_4)_6Cl_2$:Eu,Mn, $Sr(PO_4)_6Cl_2$:Eu,Mn and $Ba(PO_4)_6Cl_2$:Eu,Mn; and red phosphors such as, for example, $Y_2O_2S$:Eu, $La_2O_2S$:Eu, $Y_2O_3$:Eu, $Gd_2O_2S$:Eu and $K_2SiF_6$:Mn. Other examples of the inorganic phosphor include YAG phosphors such as $Y_3(Al,Ga)_5O_{12}$:Ce(Y,Gd)$_3Al_5O_{12}$:Ce and $Lu_3Al_5O_{12}$:Ce, $Y_3Al_5O_{12}$:Ce, TAG phosphors such as $Tb_3Al_5O_{12}$:Ce, (Ba,Sr)$_2SiO_4$:Eu phosphors, $Ca_3Sc_2Si_3O_{12}$:Ce phosphors, silicate phosphors such as $(Sr,Ba,Mg)_2SiO_4$:Eu, $(Ca,Sr)_2Si_5N_8$:Eu, nitride phosphors such as $(Ca,Sr)AlSiN_3$:Eu and $CaSiAlN_3$:Eu, oxynitride phosphors such as $Cax(Si,Al)_{12}(O,N)_{16}$:Eu, $(Ba,Sr,Ca)Si_2O_2N_2$:Eu phosphors, $Ca_8MgSi_4O_{16}C_{12}$:Eu phosphors, and phosphors such as $SrAl_2O_4$:Eu,$Sr_4Al_{14}O_{25}$:Eu.

A quantum dot is a phosphor having excellent quantum efficiency, has a discrete energy level with electrons/holes and excitons confined in a nanosize semiconductor crystal (having a diameter of, for example, about 2 nm to 10 nm) in all directions in a three-dimensional space, and enables a peak wavelength (light emission color) of emission light to be freely selected by changing the size of the dot. Examples of the material used for the quantum dot include materials obtained by combining Zn, Cd, Pb or the like that can turn into a divalent cation and O, S, Se, Te or the like that can turn into a divalent anion (e.g., cadmium selenide (CdSe) and zinc sulfide (ZnS)), materials obtained by combining Ga, In or the like that can turn into a trivalent cation and P, As, Sb or the like that can turn into a trivalent anion (e.g., indium phosphide (InP) and gallium arsenide (GaAs)), and a chalcopyrite compounds (e.g., $CuInSe_2$). One of preferred examples of the material for the quantum dot phosphor is CdSe.

Compounds that emit delayed fluorescence are discussed in "State-of-the-Art Organic Light-Emitting Diodes" (edited by Chihaya Adachi and Hiroshi Fujimoto, published by CMC Publishing Co., Ltd.), pages 87-103. The document indicates that when energy levels in a singlet excited state and a triplet excited state of a light-emitting material are brought close to each other, reverse energy transfer to the singlet excited state from the triplet excited state normally with a low transition probability occurs with high efficiency so that thermally activated delayed fluorescence (TADF) is generated, and this document describes a mechanism of generation of delayed fluorescence. The light emission of delayed fluorescence can be determined by transient PL (photo luminescence) measurement.

A compound that makes a transition from a triplet excited state to a singlet excited state with high efficiency and emits fluorescence, including a compound that generates thermally activated delayed fluorescence, is referred to as a "compound that emits delayed fluorescence."

Normally, emission of fluorescence occurs in a singlet excited state generated after the light-emitting material is photoexcited. In the triplet excited state of the light-emitting material generated by intersystem crossing, thermal deactivation occurs so that fluorescence is not emitted, in an environment at room temperature. On the other hand, even when a triplet excited state is generated, a compound that emits delayed fluorescence emits fluorescence after the triplet excited state is rapidly converted into a singlet excited state as described above so that even the triplet excited state that cannot contribute to light emission in a normal fluorescence-emitting material can contribute to emission of fluorescence. Therefore, when a compound that generates thermally activated delayed fluorescence is used, it is possible to obtain light emission with high efficiency.

The triplet excited state of a compound that emits delayed fluorescence is rapidly converted into a singlet excited state, and therefore has a characteristic that singlet oxygen is hardly generated. Singlet oxygen may cause degradation of the light-emitting material by oxidation because the singlet oxygen has strong oxidizing power. Singlet oxygen may be produced by electron-energy exchange between a triplet excited state of a light-emitting material and a triplet oxygen molecule in a ground state. As described above, a compound that emits delayed fluorescence has the property that the triplet excited state is rapidly converted into the singlet excited state, i.e., the triplet excited state has a short lifetime. Thus, the probability of direct collision between the triplet excited state of the light-emitting material and triplet oxygen in a ground state decreases so that singlet oxygen is hardly produced. We found that owing to this characteristic, use of a compound that generates thermally activated delayed fluorescence suppresses degradation of a light-emitting material so that a change in chromaticity with time is suppressed to improve the durability of the light-emitting material.

As a molecular design to bring the energy level of the singlet excited state and the energy level of the triplet excited state close to each other, it is effective to bond an electron donor skeleton and an electron acceptor skeleton to each other in the same molecule. This enables separation between the highest occupied molecular orbital (HOMO) and the lowest unoccupied molecular orbital (LUMO) in the molecule. The electron donor skeleton and the electron acceptor skeleton may be bonded to each other directly or via a linking group. The linking group in this example is preferably a skeleton containing an aromatic hydrocarbon.

Examples of the electron donor skeleton include skeletons having an amine nitrogen atom. Among them, skeletons containing a diarylamine or a triarylamine, skeletons containing carbazole, skeletons containing benzocarbazole, skeletons containing indolocarbazole, skeletons containing phenoxazine, and skeletons containing phenothiazine are preferred. Among them, skeletons containing carbazole, skeletons containing benzocarbazole, skeletons containing indolocarbazole, and skeletons containing phenoxazine are more preferred, and skeletons containing carbazole and skeletons containing phenoxazine are still more preferred.

On the other hand, examples of the electron acceptor skeleton normally include skeletons containing a substituent having an electron withdrawing property. The electron withdrawing group is called also an electron accepting group and is an atomic group that attracts an electron from a substituted atomic group by the inductive effect and/or the resonance effect in the organic electron theory. Examples of the electron withdrawing group include ones having a positive value as a substituent constant (σp (para)) of Hammett's Rule. The substituent constant (σp (para)) of Hammett's Rule can be cited from Kagaku Binran Kiso-Hen Revised 5th Edition (II, p. 380).

Although the phenyl group also has a positive value in some examples, the electron withdrawing groups according to this disclosure do not include a phenyl group.

Examples of the electron withdrawing group include —F (σp: +0.20), —Cl (σp: +0.28), —Br (σp: +0.30), —I (σp: +0.30), —$CO_2R^{12}$ (σp: +0.45 with the proviso that $R^{12}$ is an ethyl group), —$CONH_2$ (σp: +0.38), —$COR^{12}$ (σp: +0.49 with the proviso that $R^{12}$ is a methyl group), —$CF_3$ (σp: +0.51), —$SO_2R^{12}$ (σp: +0.69 with the proviso that $R^{12}$ is a methyl group), —$NO_2$ (σp: +0.81), and the like. $R^{12}$s each independently represent a hydrogen atom, a substituted or unsubstituted aromatic hydrocarbon group with a ring-forming carbon number of 6 o 30, a substituted or unsubstituted heterocyclic group with a ring-forming carbon number of 5 o 30, a substituted or unsubstituted $C_{1-30}$ alkyl group, or a substituted or unsubstituted $C_{1-30}$ cycloalkyl group. Specific examples of these groups include examples similar to those described above.

Among them, skeletons containing a heteroaryl group having a partial structure in which a carbon atom and a nitrogen atom are connected by a double bond, skeletons containing a fluorinated substituent, skeletons containing a cyano group, skeletons containing a carbonyl group, skeletons containing sulfoxide or disulfoxide, skeletons containing a phosphine oxide group and the like are preferred. Among them, skeletons containing a heteroaryl group having a partial structure in which a carbon atom and a nitrogen atom are connected by a double bond, skeletons containing a fluorinated substituent, and skeletons containing a cyano group are more preferred from the viewpoint of the stability of the compound.

Among the skeletons containing a heteroaryl group having a partial structure in which a carbon atom and a nitrogen atom are connected by a double bond, specifically, skeletons containing pyridine, pyrimidine, pyrazine, triazine, quinoline, quinoxaline, quinazoline or phenanthroline are preferred, and among them, skeletons containing pyrimidine, triazine, quinoxaline or quinazoline are more preferred, and skeletons containing triazine are still more preferred.

Among the skeletons containing a fluorinated substituent, skeletons containing a fluorinated aryl group or a fluoroalkyl group are more preferred. As the skeleton containing a fluorinated aryl group, fluorinated benzene rings are preferred, and specifically, skeletons containing fluorobenzene, difluorobenzene, trifluorobenzene, tetrafluorobenzene or pentafluorobenzene are more preferred. As the skeleton containing a fluoroalkyl group, skeletons containing a benzene ring substituted with a trifluoromethyl group are preferred, and among them, skeletons containing mono(trifluoromethyl)benzene or bis(trifluoromethyl)benzene are more preferred.

Among the skeletons having a cyano group, skeletons containing cyanobenzene, dicyanobenzene or tricyanobenzene are more preferred.

Examples of the compound in which an electron donor skeleton and an electron acceptor skeleton are bonded as described above are shown below, but the compound is not particularly limited thereto. From precedent documents, the compounds shown here are known to emits delayed fluorescence.

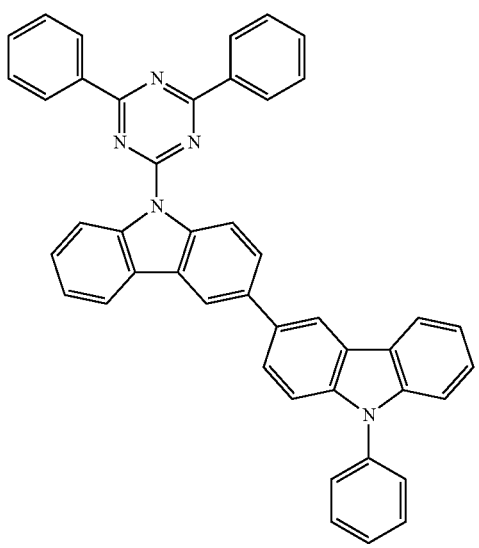
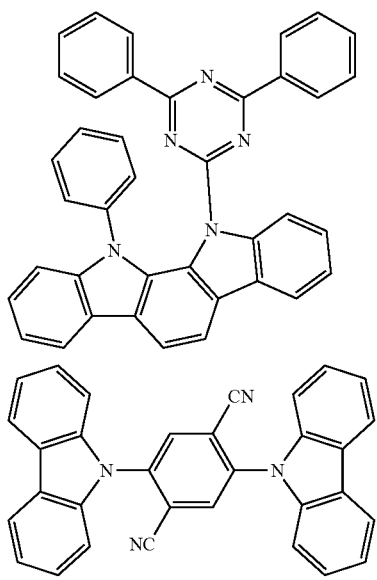
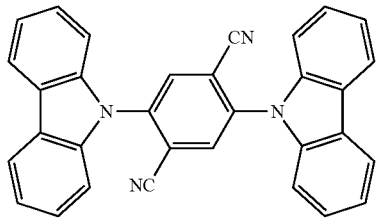
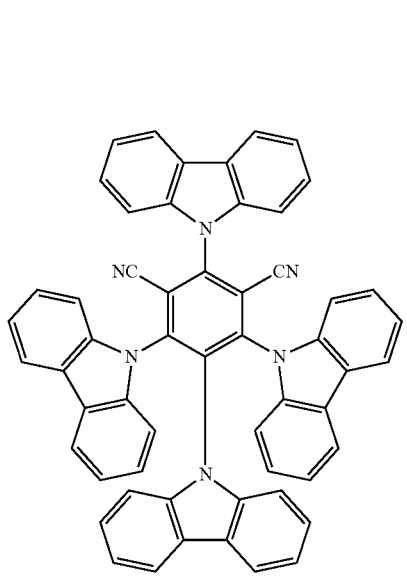
-continued
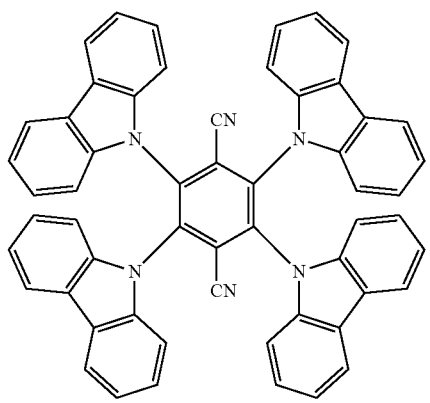
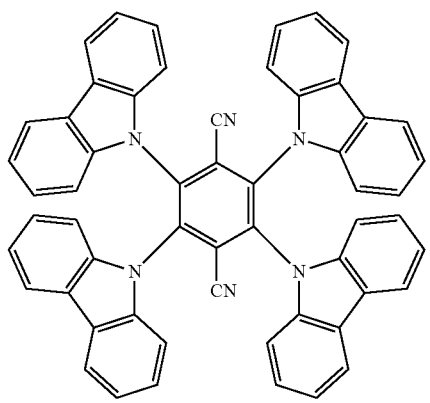
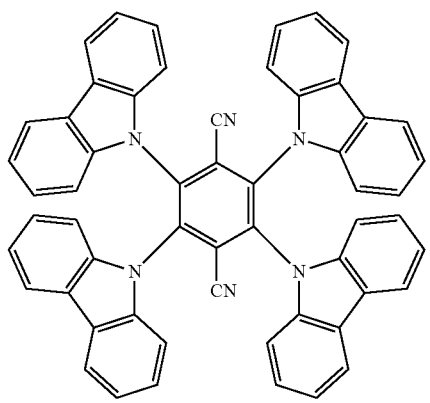

Besides the compounds in which an electron donor skeleton and an electron acceptor skeleton are bonded, compounds represented by General Formula (6) or (7) are preferred as the compound that emits delayed fluorescence.

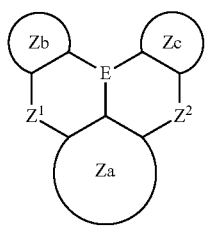

(6)

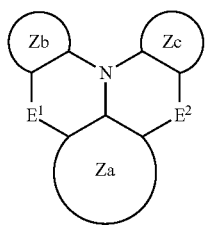

(7)

In General Formulae (6) and (7), ring Za, ring Zb and ring Zc are each independently a substituted or unsubstituted aryl ring with a ring-forming carbon number of 6 to 30, or a substituted or unsubstituted heteroaryl ring with a ring-forming carbon number of 5 to 30. Examples of the unsubstituted aryl ring with a ring-forming carbon number of 6 to 30 include aromatic hydrocarbon rings such as a benzene ring, a naphthalene ring, a phenanthrene ring, a chrysene ring, anthracene and a pyrene ring, and among them, a benzene ring is preferred from the viewpoint of securing solubility. Examples of the heteroaryl ring with a ring-forming carbon number of 5 to 30 include aromatic heteroaryl ring structures such as a pyridine ring, a quinoline ring and a phenanthroline ring, and a pyridine ring is preferred from the viewpoint of availability of raw materials and the level of difficulty of synthesis. Ring Za, ring Zb and ring Zc are preferably benzene rings. This is because the π-conjugated system of a compound represented by General Formula (6) or (7) is efficiently extended, and thus inverse intersystem crossing occurs from the triplet excited state to the singlet excited state more efficiently so that it is possible to further improve durability.

In the descriptions above and below, for example, the substituted or unsubstituted aryl group having a carbon number of 6 to 40 has a carbon number of 6 to 40 including carbon number contained in a substituent with which the aryl group is substituted, and the same applies to other substituents defining the carbon number.

Unsubstituted in "substituted or unsubstituted" means that a hydrogen atom or deuterium atom has substituted. The above holds true for examples described as "substituted or unsubstituted" in the compounds or partial structures thereof described below.

In General Formula (6), $Z^1$ and $Z^2$ are each independently an oxygen atom, NRa (nitrogen atom having substituent Ra), or a sulfur atom. When $Z^1$ is NRa, Ra may be bonded to ring Za or ring Zb to form a ring. When $Z^2$ is NRa, Ra may be bonded to ring Za or ring Zc to form a ring.

E is a boron atom, a phosphorus atom, SiRa (silicon atom having substituent Ra), or P is O.

In General Formula (7), $E^1$ and $E^2$ are each independently BRa (boron atom having substituent Ra), PRa (phosphorus atom having substituent Ra), $SiRa_2$ (silicon atom having two substituents Ra), $P(=O)Ra_2$ (phosphine oxide having two substituents Ra), or $P(=S)Ra_2$ (phosphine sulfide having two substituents Ra), $S(=O)$, or $S(=O)_2$. When $E^1$ is BRa, PRa, $SiRa_2$, $P(=O)Ra_2$ or $P(=S)Ra_2$, Ra may be bonded to ring Za or ring Zb to form a ring. When $E^2$ is BRa, PRa, $SiRa_2$, $P(=O)Ra_2$ or $P(=S)Ra_2$, Ra may be bonded to ring Za or ring Zc to form a ring.

Ras are each independently a substituted or unsubstituted aryl group, a substituted or unsubstituted heteroaryl group, or a substituted or unsubstituted alkyl group.

Ra is preferably a group with a carbon number of 6 to 40 including a substituent. Ra is more preferably a substituted or unsubstituted aryl group. Examples of the substituted or unsubstituted aryl group include a substituted or unsubstituted phenyl group, a substituted or unsubstituted biphenyl group, a substituted or unsubstituted fluorenyl group, a substituted or unsubstituted naphthyl group, and a substituted or phenanthrenyl group, and a substituted or unsubstituted phenyl group is more preferable.

$Z^1$ and $Z^2$ are each preferably an oxygen atom or NRa. This is because the it-conjugated system of a compound represented by General Formula (6) is efficiently extended, and thus inverse intersystem crossing occurs from the triplet excited state to the singlet excited state more efficiently so that it is possible to further improve durability.

E is preferably a boron atom, and $E^1$ and $E^2$ are each preferably BRa. This is because the π-conjugated system of a compound represented by General Formula (6) is efficiently extended, and thus inverse intersystem crossing occurs from the triplet excited state to the singlet excited state more efficiently so that it is possible to further improve durability.

In all the above groups, the hydrogen may be deuterium. The same applies to a compound described below or a partial structure thereof.

In all the groups described above, the substituent when substituted is an alkyl group, a cycloalkyl group, a heterocyclic group, an alkenyl group, a cycloalkenyl group, an alkynyl group, an aryl group, a heteroaryl group, a hydroxyl group, a thiol group, an alkoxy group, an alkylthio group, an aryl ether group, an aryl thioether group, a halogen, a cyano group, an aldehyde group, a carbonyl group, a carboxyl group, an oxycarbonyl group, an amide group, a sulfonyl group, a sulfonate ester group, a sulfonamide group, an amino group, a nitro group, a silyl group, a siloxanyl group, a boryl group, or a phosphine oxide group. These substituents may be further substituted by the substituents described above.

The compound represented by General Formula (6) or (7) is a molecule capable of separating a HOMO orbit and a LUMO orbit by a multiple resonance effect when an electron donor amine nitrogen atom and an electron acceptor boron atom are advantageously disposed as described in, for example, Adv. Mater., 2016, 28, 2777-2781. From the viewpoint of separating the HOMO orbital and the LUMO orbital with clarity, and bringing the singlet excited state and the triplet excited state closer to each other to facilitate emission of delayed fluorescence, it is preferable that E is a boron atom which has high electron acceptor properties, and both $Z^1$ and $Z^2$ are NRa groups having high electron donor properties.

Owing to a multiple resonance effect, the compound represented by General Formula (6) or (7) has a light emission spectrum sharper than that of a compound in which an electron donor skeleton and an electron acceptor skeleton are bonded so that it is possible to obtain light emission with a high color purity. That is, the compound represented by General Formula (6) or (7) is preferred because it is advantageous for improving the color gamut of a display. In the compound represented by General Formula (6) or (7), ring Za, ring Zb and ring Zc are present on the periphery of atom E in General Formula (6) or (7) in which mainly the LUMO orbit is localized, and therefore the LUMO orbit can be delocalized at atom E to each ring. By delocalizing the LUMO orbit, a multiple resonance effect is efficiently exerted so that it is possible to obtain light emission with a higher color purity.

Further, a structure is more preferred in which Ra of General Formula (6) or (7) is bonded to at least one of ring Za, ring Zb and ring Zc. This is because when Ra is bonded to at least one of ring Za, ring Zb and ring Zc, the steric protection effect of E in General Formula (6) and $E^1$ and $E^2$ in General Formula (7) can be expected to be further enhanced, leading to further improvement of the effect of suppressing a decrease in fluorescence quantum yield.

Examples of the compound represented by General Formula (6) or (7) are shown below, but the compound is not limited thereto.

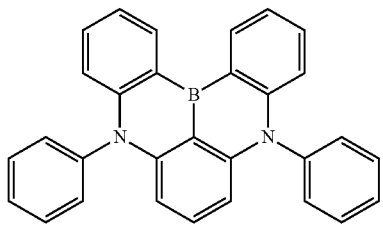

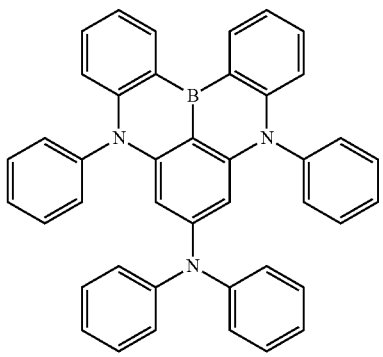

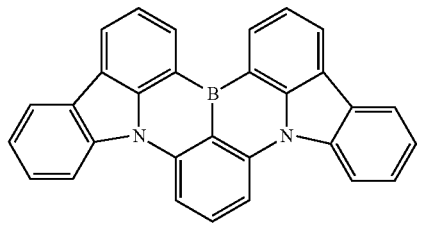

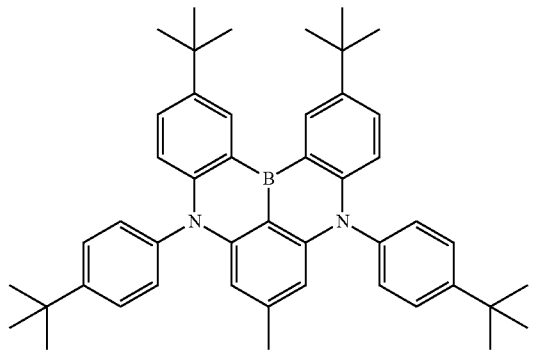

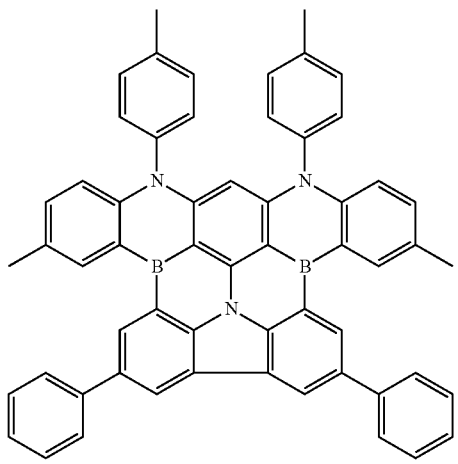

-continued
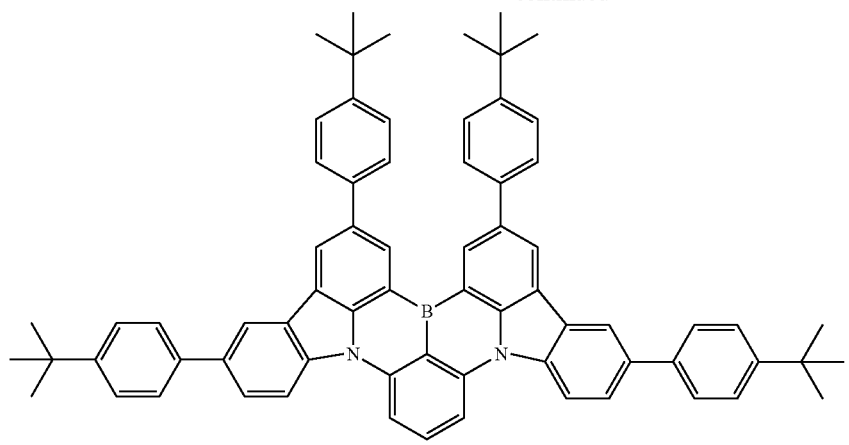
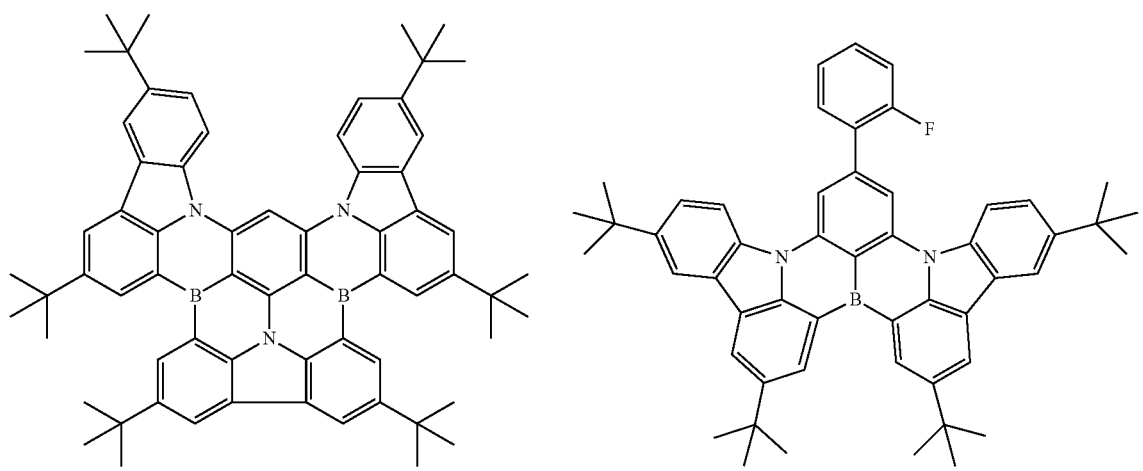
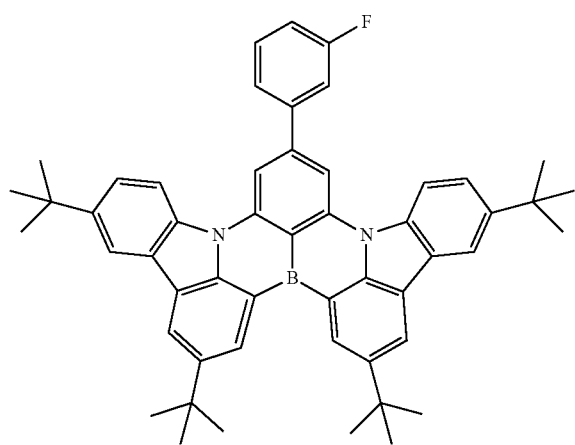

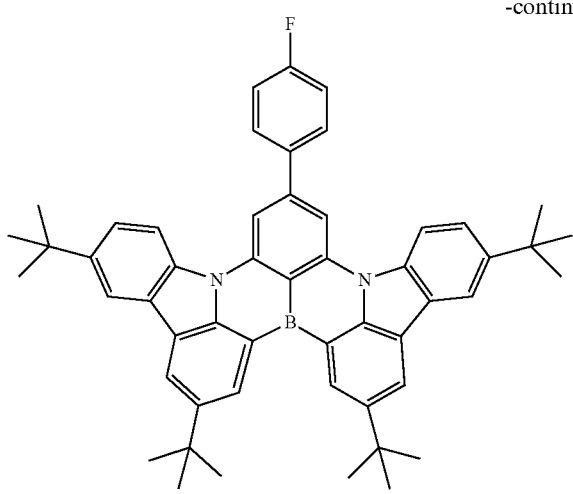

Binder Resin in Color Conversion Layer (A) and Color Conversion Layer (B)

In the color conversion sheet, it is preferred that the color conversion layer (A) and the color conversion layer (B) contain a binder resin in addition to a light-emitting material. As the binder resin, a material excellent in molding processability, transparency, heat resistance and the like is suitably used. Examples of the binder resin include known ones such as photocurable resist materials having a reactive vinyl group such as acrylic acid-based, methacrylic acid-based, vinyl polycinnamate-based, or cyclized rubber-based one, epoxy resins, silicone resins (including organopolysiloxane cured objects (cross-linked objects) such as silicone rubbers and silicone gels), urea resins, fluorine resins, polycarbonate resins, acrylic resins, urethane resins, melamine resins, polyvinyl resins, polyamide resins, phenol resins, polyvinyl alcohol resins, polyvinyl butyral resins, cellulose resins, aliphatic ester resins, aromatic ester resins, aliphatic polyolefin resins, and resin aromatic polyolefin resins. For the binder resin, a mixture or copolymer of these resins may be used. Examples thereof include copolymers of methyl methacrylate and an aliphatic polyolefin resin. These resins are designed as appropriate, whereby the binder resin useful for the color conversion sheet according to the example is obtained.

The binder resin is preferably any of an acrylic resin, a copolymer resin containing an acrylic acid ester or methacrylic acid ester portion, a polyester resin, an aliphatic polyolefin resin and a copolymer thereof, among the above-mentioned resins, from the viewpoint of the transparency and dispersibility of the organic light-emitting material.

Other Additives

In addition to the binder resin and the light-emitting material, a filler; an antioxidant; a processing and heat stabilizer; a light resistance stabilizer such as a UV absorber; a dispersant and a leveling agent for stabilizing a coating film; a plasticizer; a crosslinking agent such as an epoxy compound; a curing agent such as amine, acid anhydride and imidazole; a pigment; an adhesive auxiliary agent such as a silane coupling agent as a modifier for a sheet surface; and the like can be added to the color conversion sheet.

Examples of the filler include, but are not limited to, a fine particle such as fumed silica, glass powder and quartz powder; titanium oxide; zirconia oxide; barium titanate; zinc oxide; and a silicone fine particle. In addition, these fillers may be used alone or in combination.

Examples of the antioxidant may include, but are not limited to, phenolic antioxidants such as 2,6-di-tert-butyl-p-cresol and 2,6-di-tert-butyl-4-ethylphenol. These antioxidants may be used alone or in combination.

Examples of the processing and heat stabilizer include, but are not limited to, phosphorus-based stabilizers such as tributyl phosphite, tricyclohexyl phosphite, triethylphosphine, and diphenylbutylphosphine. These stabilizers may be used alone or in combination.

Examples of the light resistance stabilizer include, but are particularly not limited to, benzotriazoles such as 2-(5-methyl-2-hydroxyphenyl)benzotriazole, and 2-[2-hydroxy-3,5-bis(α,α-dimethylbenzyl)phenyl]-2H-benzotriazole. In addition, these light resistance stabilizers may be used alone or in combination.

The content of these additives in the color conversion sheet depends on a molar absorption coefficient, a fluorescent quantum yield and an excitation wavelength absorption intensity of the compound, and a thickness and a transmittance of a film to be produced, and is normally $1.0 \times 10^{-3}$ parts by mass or more and 30 parts by mass or less, more preferably $1.0 \times 2$ parts by mass or more and 15 parts by mass or less, particularly preferably $1.0 \times 10^{-1}$ parts by mass or more and 10 parts by mass or less based on 100 parts by mass of the binder resin.

Solvent

The color conversion sheet may contain a solvent. The solvent is not limited to a particular solvent so long as it can adjust the viscosity of a resin in a fluid state and does not have an excessive influence on the light emission and durability of a light-emitting substance. Examples of the solvent include water, 2-propanol, ethanol, toluene, methyl ethyl ketone, methyl isobutyl ketone, cyclopentanone, cyclohexanone, hexane, heptane, acetone, methyl acetate, ethyl acetate, butyl acetate, propyl acetate, isopropyl acetate, terpineol, texanol, methyl cellosolve, ethyl cellosolve, butyl carbitol, butyl carbitol acetate, 1-methoxy-2-propanol, propylene glycol monomethyl ether acetate, tetrahydrofuran, tetrahydropyran, and 1,4-dioxane, and it is also possible to use two or more of these solvents in combination. Among these solvents, toluene and ethyl acetate are particularly suitably used because they do not cause degradation of the compound represented by General Formula (1) and the amount of the solvent remaining after drying is small.

Method of Producing Color Conversion Sheet

Hereinafter, an example of a method of producing the color conversion sheet will be described. In this method of preparing the color conversion sheet, first, a composition to prepare the color conversion layer is prepared as follows.

Predetermined amounts of the above-described light-emitting material, binder resin, solvent and the like are mixed. The aforementioned components are mixed in a predetermined composition, and then homogeneously mixed and dispersed using a stirring/kneading machine such as a homogenizer, a rotation/revolution type stirrer, a three-roll roller, a ball mill, a planetary ball mill, and a bead mill, to obtain a color conversion composition. After being mixed and dispersed or during being mixed and dispersed, defoaming in a vacuum or under a reduced pressure is also preferably performed. In addition, a specific component may be mixed in advance, or treatment such as aging may be performed. A desired solid content can be obtained by removing the solvent by an evaporator.

Figure 3:
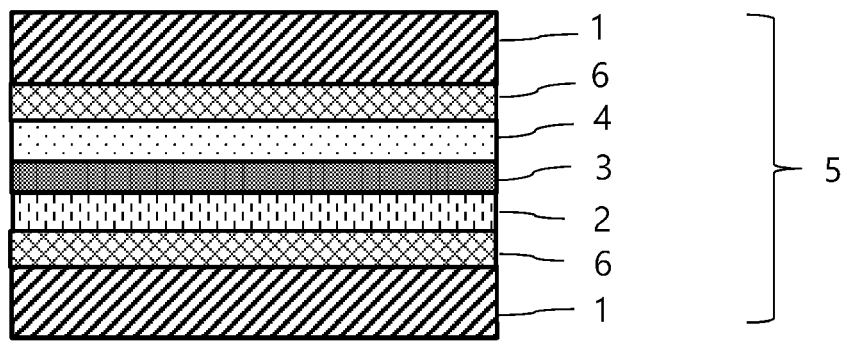
FIG. 3 is a schematic sectional view showing an example of a color conversion sheet.

A typical example of the structure of the color conversion sheet is shown in FIG. 1 mentioned above. In addition, for preventing degradation of the color conversion layer by oxygen, moisture and heat, a barrier layer 6 may be further provided as shown in FIG. 3.

The thickness of the color conversion sheet is not particularly limited, and is preferably 1 to 5000 μm in terms of the total thickness of all the layers. When the thickness is 1 or more, sufficient film strength can be secured so that problems such as film breakage hardly occur. When the thickness is 5000 μm or less, a sheet excellent in handleability can be obtained. The thickness is more preferably 10 to 1000 still more preferably 15 to 500 particularly preferably 30 to 300 μm.

The film thickness of the color conversion sheet refers to a film thickness (average film thickness) measured based on JIS K7130 (1999), Plastics-Film and sheeting-Determination of thickness by mechanical scanning, Method A.

Base Layer

For the base layer, known metals, films, glasses, ceramics, papers and the like can be used without any particular limitation. Specific examples of the base layer include metal plates or foils of aluminum (including aluminum alloy), zinc, copper, iron or the like; plastic films formed of cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin, thermoplastic fluororesin, a copolymer of tetrafluoroethylene and ethylene (ETFE), an α-polyolefin resin, a polycaprolactone resin, an acrylic resin, a silicone resin and a copolymer resin of any of these resins with ethylene; paper obtained by laminating the plastic, or paper coated with the plastic; paper on which the metal is laminated or vapor-deposited; and plastic films on which any of the metals is laminated or vapor-deposited. When the base layer is a metal plate, the surface may be subjected to plating treatment with chromium, nickel or the like, or to ceramic treatment.

Among these materials, glass and resin films are preferably used from the viewpoint of ease of producing the color conversion sheet and ease of molding the color conversion sheet. In addition, a film having a high strength to prevent the possibility of breakage or the like in handling the film-like base is preferable. In view of those required characteristics and economy, resin films are preferred; among them, in view of economy and handleability, preferred are plastic films selected from the group consisting of PET, polyphenylene sulfide, polycarbonate, and polypropylene. When the color conversion sheet is dried or when the color conversion sheet is shaped under pressure at a high temperature of 200° C. or more by an extruder, a polyimide film is preferred in view of heat resistance. The surface of the base layer may be subjected to release treatment for easily peeling the sheet.

The thickness of the base layer is not particularly limited, and the lower limit thereof is preferably 5 μm or more, more preferably 25 μm or more, still more preferably 38 μm or more. The upper limit thereof is preferably 5,000 μm or less and more preferably 3,000 μm or less.

Color Conversion Layer

Next, an example of a method of producing the color conversion layer in the color conversion sheet will be described. The color conversion composition produced by the above-described method is applied onto a base layer, and dried. For the application, a reverse roll coater, a blade coater, a slit die coater, a direct gravure coater, an offset gravure coater, a kiss coater, a natural roll coater, an air knife coater, a roll blade coater, a two-stream coater, a rod coater, a wire bar coater, an applicator, a dip coater, a curtain coater, a spin coater, a knife coater or the like can be used. For obtaining film thickness uniformity for the color conversion layer, it is preferable to apply the color conversion composition using a slit die coater or a dip coater.

The color conversion layer can be dried using a general heating device such as a hot air dryer and an infrared dryer. In this example, heating conditions include usually 1 minute to 5 hours at 40 to 250° C. and preferably 2 minutes to 4 hours at 60° C. to 200° C. Stepwise heating and curing such as step cure is also available.

After producing the color conversion layer, the base can be changed as necessary. In these examples, a simple method includes, but are not limited to, a method of replacing the base using a hot plate, a method using a vacuum laminator or a dry film laminator and the like.

A thickness of the color conversion layer is not particularly limited, but is preferably 1 to 1000 μm, more preferably 10 to 1000 μm. When the thickness is 1 μm or more, sufficient film strength can be secured so that problems such as film breakage hardly occur. When the thickness is 5000 μm or less, a sheet excellent in handleability can be obtained. The thickness is more preferably 10 to 100 μm, still more preferably 15 to 100 μm, particularly preferably 30 to 100 μm.

Barrier Layer

The barrier layer can be appropriately used when gas barrier properties are imparted to the color conversion layer. Specific examples of the barrier layer include metal oxide thin films and metal nitride thin films of inorganic oxides such as silicon oxide, aluminum oxide, titanium oxide, tantalum oxide, zinc oxide, tin oxide, indium oxide, yttrium oxide, and magnesium oxide, inorganic nitrides such as silicon nitride, aluminum nitride, titanium nitride, and silicon carbide nitride, mixtures thereof, and products obtained by adding another element thereto; and films formed of various kinds of resins such as polyvinylidene chloride, acrylic-based resins, silicone-based resins, melamine-based resins, urethane-based resins, fluorine-based resins, and polyvinyl alcohol-based resins such as a saponified product of vinyl acetate. In addition, examples of a film having a barrier function against moisture include films made of various resins such as polyethylene, polypropylene, nylon, polyvinylidene chloride, a copolymer of vinylidene chloride and vinyl chloride or vinylidene chloride and acrylonitrile, a fluorine-based resin, and a polyvinyl alcohol-based resin like a saponified vinyl acetate.

The barrier layer may be provided on both surfaces or only one surface of the color conversion layer.

In addition, depending on a function required for the color conversion sheet, an auxiliary layer having a function such as a light extraction function, an antireflection function, an antiglare function, an antireflection antiglare function, a hard coating function (friction resistance function), an antistatic function, an antifouling function, an electromagnetic wave shielding function, an infrared cutting function, an ultraviolet cutting function, a polarization function, or a toning function may be further provided.

Excitation Light

Any type of light source for excitation light can be used as long as it exhibits light emission in a wavelength region which allows the light-emitting material to absorb light. For example, any light source such as a fluorescent light source such as a hot-cathode tube, a cold-cathode tube or an inorganic EL, an organic electroluminescence element light source, a LED light source, or an incandescent light source can be used in principle, and among them, an LED is a suitable light source. For displays and lighting devices, a blue LED with excitation light having a wavelength of 400 to 500 nm is a more suitable light source from the viewpoint of enabling enhancement of the color purity of blue light. If the wavelength of excitation light is in a range above 500 nm, white light cannot be formed because there is a lack in blue light. It is not preferred that the wavelength of excitation light is below 400 nm because the light-emitting material or an organic compound such as resin is likely to be degraded by light.

The excitation light may have one type of emission peak or two or more types of emission peaks, but an excitation light having one type of emission peak is preferred for enhancing the color purity. A plurality of excitation light sources having different emission peaks can be freely combined with each other.

A color conversion sheet according to another example is a color conversion sheet that converts incident light into light having a wavelength different from that of the incident light, in which the color conversion sheet includes at least a color conversion layer, a resin layer and a base layer in this order, the color conversion layer contains a light-emitting material (a) that exhibits light emission with a peak wavelength observed in a region of 500 nm or more and less than 580 nm and a light-emitting material (b) that exhibits light emission with a peak wavelength observed in a region of 580 nm or more and 750 nm or less, a haze value of the color conversion sheet is 20% or more and 90% or less, and $n_A > n_B$ and $n_B < n_C$ is satisfied, where $n_A$ is a refractive index of the color conversion layer, $n_B$ is a refractive index of the resin layer, and $n_C$ is a refractive index of the base layer. The resin layer satisfying $n_A > n_B$ and $n_B < n_C$ can also be referred to as a low-refractive layer.

Figure 4:
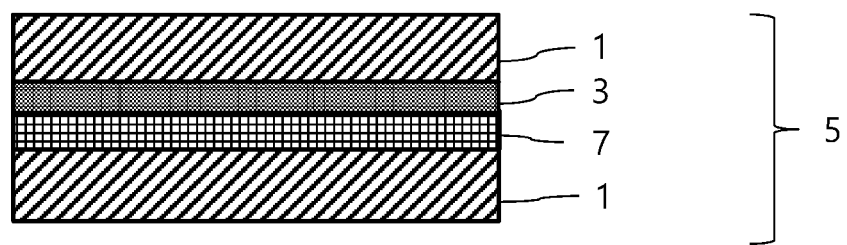
FIG. 4 is a schematic sectional view showing an example of a color conversion sheet.

FIG. 4 shows an example of a configuration of the color conversion sheet of this example. The color conversion sheet 5 includes a base layer 1, and a color conversion layer 7 and a resin layer 3 are laminated on the base layer 1. The color conversion sheet may have a configuration in which the base layer 1 is further disposed on the resin layer 3 so that the color conversion layer 7 and the resin layer 3 are sandwiched between the base layers 1. It is preferred that the resin layer 3 is disposed at a position opposite to the light source side when viewed from the color conversion layer 7. Where $n_A$ is a refractive index of the color conversion layer, $n_B$ is a refractive index, and $n_C$ is a refractive index of the base layer, it is necessary to satisfy $n_A > n_B$ and $n_B < n_C$. When the resin layer is present at this position, light emitted from the light source is reflected at an interface between the color conversion layer and the resin layer, and therefore leakage of light to the outside of each layer can be suppressed so that color conversion efficiency can be further improved, and good durability can be obtained.

The color conversion layer 7 in this example contains both a light-emitting material (a) that exhibits light emission with a peak wavelength observed in a region of 500 nm or more and less than 580 nm and a light-emitting material (b) that exhibits light emission with a peak wavelength observed in a region of 580 nm or more and 750 nm or less. It is preferred that the color conversion layer 7 contains a binder resin in addition to the light-emitting material. The color conversion layer 7 may contain light scattering particles for controlling the haze value.

The haze value, the light scattering particles, the resin layer, the light-emitting material, the binder resin, the base layer, the barrier layer and the production method for the color conversion sheet are the same as in the above-described example.

Light Source Unit

Figure 5:
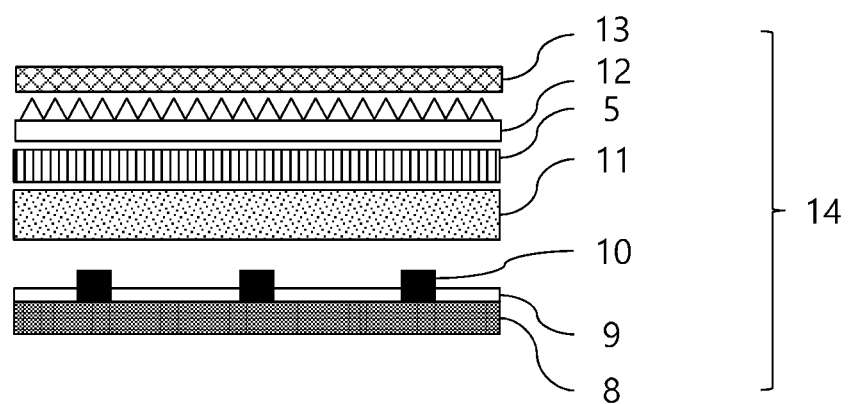
FIG. 5 is a schematic sectional view showing an example of a light source unit.

Our light source unit includes at least a light source and a color conversion sheet. In the light source unit, it is preferred that the light source, the color conversion layer (B), the resin layer and the color conversion layer (A) are arranged in this order. The light source unit may include another optical sheet in addition to the light source and the color conversion sheet. Examples of the optical sheet include a prism sheet, a polarizing reflective film, and a diffusion sheet. Examples of the typical configuration include a configuration in which as shown in FIG. 5, a substrate 8, a reflection layer 9 and a light source 10 are laminated, the color conversion sheet 5 is disposed between a diffusion plate 11 and a prism sheet 12, and a polarizing reflective film 13 is disposed on a surface of the prism sheet 12 on a sided opposite to the light source. From the viewpoint of thickness reduction, productivity and light durability, the number of optical sheets present above the color conversion sheet is preferably 2 or less. The term "above the color conversion sheet" means a side opposite to the light source with respect to the color conversion sheet. When the number of optical sheets is 2 or less, reflection of light can be suppressed, and therefore the number of excitations of the light-emitting material can be reduced so that it is possible to prevent deterioration of durability. The light source of FIG. 5 has a so-called direct-type configuration, and the arrangement of the light source is not particularly limited. When the light source unit includes the color conversion sheet, the method of arranging the light source and the color conversion sheet is not particularly limited as long as the configuration satisfies the above-described order, and a configuration in which the light source and the color conversion sheet are in close contact with each other may be adopted, or a remote phosphor form in which the light source and the color conversion sheet are separated from each other may be adopted. A configuration may be adopted in which a color filter is further included for the purpose of enhancing the color purity.

Since as described above, excitation light of 400 to 500 nm has relatively low excitation energy so that decomposition of the light-emitting material can be prevented, and the light source is preferably a light-emitting diode having a maximum light emission of 400 to 500 nm.

The light source unit can be used in applications such as displays, lighting devices, interiors, signs, and signboards. The light source unit is particularly suitably used for displays and lighting devices.

EXAMPLES

Hereinafter, our sheets, light sources, units and displays will be described by way of examples, but this disclosure is not limited to these examples.

Measurement of Haze and Total Light Transmittance

The haze and the total light transmittance of each of the color conversion sheet, the color conversion layer (A) and the color conversion layer (B) produced in Examples and Comparative Examples were measured in accordance with ASTM D 1003 (2013) using NDH 7000 (manufactured by NIPPON DENSHOKU INDUSTRIES CO., LTD.). The number of measurements for each item was 1.

Measurement of Refractive Index

The refractive index of each layer (each of $n_{A1}$, $n_{A2}$, $n_B$, $n_C$, $n_{D1}$ and $n_{D2}$) was obtained by measuring the refractive index of a resin film formed by individually applying a composition for producing each layer onto a PET film. Onto "Lumirror" U48 (manufactured by Toray Industries, Inc., thickness: 50 μm), the composition for producing each layer was applied to an average film thickness of 2 μm using a Baker applicator, and heated and dried at 100° C. for 20 minutes to form the resin film for measurement. The refractive index of the formed resin film to light having a wavelength of 589.3 nm was measured using a reflectance spectrometer FE-3000 (manufactured by Otsuka Electronics Co., Ltd.).

Measurement of Color Conversion Characteristics

On a light-emitting device equipped with a blue LED (manufactured by USHIO EPITEX INC.; model number SMBB450H-1100, emission peak wavelength: 450 nm), each color conversion sheet to be evaluated was placed to arrange the light source, the color conversion layer (B), the resin layer and the color conversion layer (A) in this order. The blue LED was turned on by applying a current of 100 mA to the light-emitting device, and an emission spectrum, an emission intensity at a peak wavelength, and chromaticity were measured using a spectral radiance meter (CS-1000, manufactured by KONICA MINOLTA, INC.). The distance between each color conversion sheet and the blue LED element was 3 cm.

Evaluation of In-Plane Uniformity

A liquid crystal monitor (SW2700PT) manufactured by BenQ Corporation was disassembled, and a color conversion sheet housed in the monitor was replaced with a color conversion sheet prepared in Examples and Comparative Examples described later, and then the monitor was assembled to its former state. At this time, a backlight unit has a configuration of "reflection film/light guide plate/diffusion sheet/color conversion sheet/prism sheet/reflective polarizing film." Using a spectral radiance meter (CS-1000, manufactured by KONICA MINOLTA, INC.), the color coordinates u' and v' were measured at nine points, and the in-plane variation Δu'v' was calculated from the following equations:

$$\Delta u' = u'(max) - u'(min.)$$

$$\Delta v' = v'(max) - v'(min.)$$

$$\Delta u'v' = \{(\Delta u')^2 + (\Delta v')^2\}^{1/2}$$

Δu'v' is preferably 0.02 or less, extremely preferably 0.015 or less.

Light Durability Test

On a light-emitting device equipped with a blue LED (manufactured by USHIO EPITEX INC.; model number SMBB450H-1100, emission peak wavelength: 450 nm), each color conversion sheet to be evaluated was placed to arrange the light source, the color conversion layer (B), the resin layer and the color conversion layer (A) in this order. The blue LED was turned on by applying a current of 100 mA to the light-emitting device, and the peak intensity at an emission wavelength where color conversion occurred was measured using a spectral radiance meter (CS-1000, manufactured by KONICA MINOLTA, INC.). The distance between each color conversion sheet and the blue LED element was 3 cm. Thereafter, the durability of the color conversion sheet was evaluated by continuously emitting light from the blue LED element at 50° C. and 80% RH, and measuring a time until the light emission intensity of the phosphor decreased by 10% from the initial value. The time until the light emission intensity of the phosphor decreases by 10% from the initial value is preferably 200 hours or more, extremely preferably 400 hours or more.

Light-Emitting Material

In the following Examples and Comparative Examples, compounds G-1, G-3 and R-1 are compounds shown below.

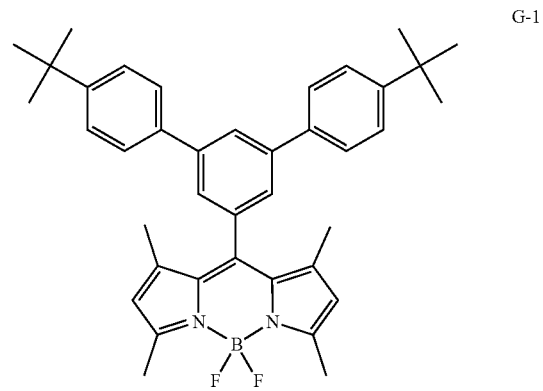

G-1

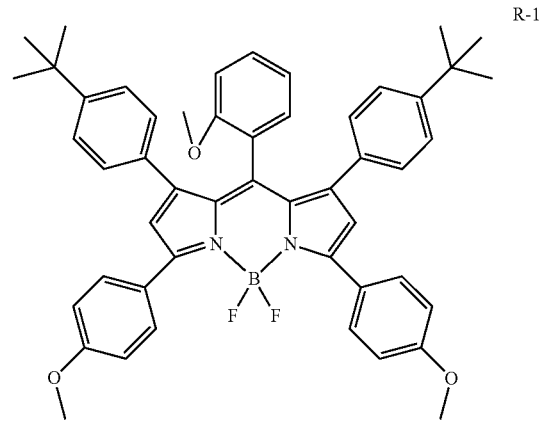

R-1

-continued

G-3

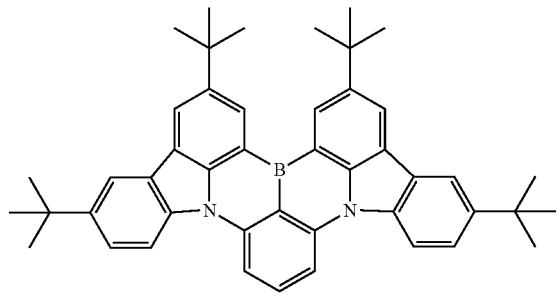

Compounds G-1 (emission peak wavelength: 515 nm) and G-3 (emission peak wavelength: 527 nm) were synthesized by a known method.

G-2: Quantum dots (product number: 776793) (emission peak wavelength: 560 nm) manufactured by Sigma-Aldrich Co. LLC were used.

Compound R-1 (emission peak wavelength: 629.5 nm) was synthesized by a known method.

Light scattering particles S-1, S-2, S-3 and S-4 are materials shown below:
- S-1: JR-301 (titania particles manufactured by TAYCA CORPORATION, average particle diameter 300 nm)
- S-2: AA-07 (alumina particles manufactured by Sumitomo Chemical Co., Ltd., average particle diameter: 830 nm)
- S-3: SO-E6 (Silica particles manufactured by Admatechs, average particle diameter: 2000 nm)
- S-4: KMP-706 (Silicone resin particles manufactured by Shin-Etsu Chemical Co., Ltd., average particle diameter: 2000 nm).

Example 1

100 parts by weight of acrylic resin woven Cox KC-7000 manufactured by Kyoeisha Chemical Co., Ltd. as a resin, 0.4 parts by weight of G-1 as a light-emitting material, 0.3 parts by weight of S-1 as light scattering particles, and 300 parts by weight of toluene as a solvent were mixed, and the mixture was then stirred and defoamed at 1000 rpm for 20 minutes with a planetary stirring and defoaming apparatus "Mazerustar" (registered trademark) KK-400 (manufactured by Kurabo Industries Ltd.) to obtain a resin composition for forming a color conversion layer (A).

Also, a silicone resin (KR-114B manufactured by Shin-Etsu Chemical Co., Ltd.) was provided as a resin, 200 parts by weight of heptane as a solvent was mixed with 100 parts by weight of the resin, and the mixture was then stirred and defoamed at 300 rpm for 20 minutes with a planetary stirring and defoaming apparatus "Mazerustar" (registered trademark) KK-400 (manufactured by Kurabo Industries Ltd.) to obtain a resin composition for forming a resin layer.

Also, 100 parts by weight of a resin similar to the resin liquid for forming a color conversion layer (A), 0.08 parts by weight of a compound R-1 as a light-emitting material, 0.3 parts by weight of S-1 as light scattering particles, and 200 parts by mass of toluene as a solvent were mixed, and the mixture was then stirred and defoamed at 300 rpm for 20 minutes with a planetary stirring and defoaming apparatus "Mazerustar" (registered trademark) KK-400 (manufactured by Kurabo Industries Ltd.) to obtain a resin composition for forming a color conversion layer (B).

Next, the resin composition for forming a color conversion layer (A) was applied onto a base layer of "Lumirror" U48 (registered trademark) (manufactured by Toray Industries, Inc., thickness: 50 µm) using a slit die coater, and heated and dried at 120° C. for 20 minutes to form a color conversion layer (A) having an average film thickness of 18 µm.

Also, the resin composition for forming a resin layer was applied onto the color conversion layer (A) using a slit die coater, and heated and dried at 120° C. for 20 minutes to form a resin layer having an average film thickness of 10 µm.

Also, the resin composition for forming a color conversion layer (B) was applied onto a base layer of "Lumirror" U48 (registered trademark) (manufactured by Toray Industries, Inc., thickness: 50 µm) using a slit die coater, and heated and dried at 120° C. for 20 minutes to form a color conversion layer (B) having an average film thickness of 18 µm.

Next, the two units were heated and laminated to bring the resin layer and the color conversion layer (B) into direct contact with each other, thereby producing a color conversion sheet having a configuration of "base layer/color conversion layer (A)/resin layer/color conversion layer (B)/base layer."

The refractive index of each layer was measured by the above-described method using the produced color conversion sheet. The results are shown in Table 1.

Examples 2 to 8, 17 and 18 and Comparative Examples 1 to 3

Except that the compositions were changed to those shown in Tables 1 and 2, the same procedure as in Example 1 was carried out to produce color conversion sheets, and evaluation was performed. In Example 17, the resin of the resin layer was changed to polyester "Vylon" (registered trademark) 270 manufactured by TOYOBO CO., LTD. In Comparative Example 3, the resin of the resin layer was changed to acrylic resin woven Cox KC-7000 manufactured by Kyoeisha Chemical Co., Ltd. The results are shown in Tables 1 and 2.

As is apparent from comparison between Example 1 and Comparative Example 1, the in-plane uniformity in Example 1 with the haze value being 20% or more was significantly better than that in Comparative Example 1 with the haze value being less than 20%.

From a comparison of Examples 1 to 5, we found that the larger the haze value, the better the in-plane uniformity. However, as shown in Comparative Example 2, we found that if the haze value exceeds 90%, the light durability is significantly deteriorated although the in-plane uniformity is good. In Examples 3, 4 and 8, both in-plane uniformity and durability were particularly good.

From a comparison between Example 7 and Example 4, we found that as the light-emitting material of the color conversion layer (A), G-1 has light durability better than that of G-2.

From a comparison between Example 18 and Example 4, we found that as the light-emitting material of the color conversion layer (A), G-1 is comparable in light durability to G-3.

From a comparison between Example 17 and Example 4, we found that the light durability is lower when the refractive index $n_B$ of the resin layer is larger than the refractive index $n_{A1}$ of the color conversion layer (A) and the refractive index $n_{A2}$ of the color conversion layer (B) than when the refractive index $n_B$ is smaller than the refractive index $n_{A1}$ of the color conversion layer (A) and the refractive index $n_{42}$ of the color conversion layer (B).

From a comparison between Example 17 and Comparative Example 3, we found that the light durability is lower when the refractive index $n_B$ of the resin layer is equal to the refractive index $n_{41}$ of the color conversion layer (A) and the refractive index $n_{42}$ of the color conversion layer (B) than when the refractive index $n_B$ of the resin layer is larger than the refractive index $n_{41}$ of the color conversion layer (A) and the refractive index $n_{42}$ of the color conversion layer (B).

gamut was calculated from the obtained three-point color coordinate, and an area ratio to the color gamut area of the DCI-P3 standard was calculated. The area ratio is preferably 100% or more, extremely preferably 105% or more.

Relative Luminance

The luminance of white light after color conversion in Example 3 was defined as 100, and the luminances in examples described later were compared. The relative luminance (%) is a luminance relative to that in Example 3.

TABLE 1

| | | Example 1 | Example 2 | Example 3 | Example 4 | Example 5 | Example 6 | Example 7 | Example 8 |
|---|---|---|---|---|---|---|---|---|---|
| Color conversion layer (A) | Light-emitting material | G-1 | G-1 | G-1 | G-1 | G-1 | G-1 | G-2 | G-1 |
| | Amount of scattering particles added [parts by weight] (v.s. resin) | 0.3 | 0.5 | 0.65 | 1 | 1.5 | 2 | 1 | 0.5 |
| | Refractive index $n_{41}$ | 1.49 | 1.49 | 1.49 | 1.49 | 1.49 | 1.49 | 1.49 | 1.49 |
| Resin layer | Refractive index $n_B$ | 1.41 | 1.41 | 1.41 | 1.41 | 1.41 | 1.41 | 1.41 | 1.41 |
| Color conversion layer (B) | Light-emitting material | R-1 | R-1 | R-1 | R-1 | R-1 | R-1 | R-1 | R-1 |
| | Amount of scattering particles added [parts by weight] (v.s. resin) | 0.3 | 0.5 | 0.65 | 1 | 1.5 | 2 | 1 | 1.5 |
| | Refractive index $n_{42}$ | 1.49 | 1.49 | 1.49 | 1.49 | 1.49 | 1.49 | 1.49 | 1.49 |
| Base layer | Refractive index $n_C$ | 1.57 | 1.57 | 1.57 | 1.57 | 1.57 | 1.57 | 1.57 | 1.57 |
| Haze [%] | | 20 | 36 | 51 | 74 | 83 | 90 | 75 | 72 |
| In-plane uniformity Δu'v' | | 0.018 | 0.016 | 0.013 | 0.011 | 0.009 | 0.008 | 0.013 | 0.011 |
| Durability (time of decrease by 10%) [hour] | | 600 | 580 | 550 | 500 | 360 | 250 | 300 | 500 |

TABLE 2

| | | Example 17 | Example 18 | Comparative Example 1 | Comparative Example 2 | Comparative Example 3 |
|---|---|---|---|---|---|---|
| Color conversion layer (A) | Light-emitting material | G-1 | G-3 | G-1 | G-1 | G-1 |
| | Amount of scattering particles added [parts by weight] (v.s. resin) | 1 | 1 | 0.2 | 2.5 | 1 |
| | Refractive index $n_{41}$ | 1.49 | 1.49 | 1.49 | 1.49 | 1.49 |
| Resin layer | Refractive index $n_B$ | 1.57 | 1.41 | 1.41 | 1.41 | 1.49 |
| Color conversion layer (B) | Light-emitting material | R-1 | R-1 | R-1 | R-1 | R-1 |
| | Amount of scattering particles added [parts by weight] (v.s. resin) | 1 | 1 | 0.2 | 2.5 | 1 |
| | Refractive index $n_{42}$ | 1.49 | 1.49 | 1.49 | 1.49 | 1.49 |
| Base layer | Refractive index $n_C$ | 1.57 | 1.57 | 1.57 | 1.57 | 1.57 |
| Haze [%] | | 72 | 74 | 10 | 95 | 74 |
| In-plane uniformity Δu'v' | | 0.012 | 0.011 | 0.024 | 0.007 | 0.013 |
| Durability (time of decrease by 10%) [hour] | | 350 | 500 | 640 | 150 | 250 |

Calculation of Color Gamut Area Ratio

A liquid crystal monitor (SW2700PT) manufactured by BenQ Corporation was disassembled, and a color conversion sheet housed in the monitor was replaced with a color conversion sheet produced in each of examples described later, and the monitor was restored to its former state. At this time, a backlight unit has a configuration of "reflection film/light guide plate/diffusion sheet/color conversion sheet/prism sheet/reflective polarizing film." When single colors of blue, green and red were displayed on the obtained monitor, each color coordinate in a color space (x, y) was measured using a spectral radiance meter (CS-1000, manufactured by KONICA MINOLTA, INC.). An area of a color Example 9

Except that the amount of light scattering particles in the color conversion layer (A) was 1.3 parts by weight, and light scattering particles were not added to the color conversion layer (B), the same procedure as in Example 3 was carried out to produce a color conversion sheet. The color characteristics were measured by the above-described method using the produced color conversion sheet, and the result showed that there were a green light emission peak at 527 nm and a red light emission peak at 637 nm. The color gamut area ratio calculated by the above-described method was 105%. The relative luminance calculated by the above-described method was 97%. The haze value and the refractive index of each layer were measured by the above-described method. The results are shown in Table 3.

Example 10

Except that the amount of light scattering particles in the color conversion layer (A) was 2 parts by weight, and light scattering particles were not added to the color conversion layer (B), the same procedure as in Example 3 was carried out to produce a color conversion sheet. The color characteristics were measured by the above-described method using the produced color conversion sheet, and the result showed that there were a green light emission peak at 525 nm and a red light emission peak at 639 nm. The color gamut area ratio calculated by the above-described method was 108%. The relative luminance calculated by the above-described method was 93%. The haze value and the refractive index of each layer were measured by the above-described method. The results are shown in Table 3.

Example 11

Except that light scattering particles were not added for the color conversion layer (A), and the amount of light scattering particles in the color conversion layer (B) was 1.3 parts by weight, the same procedure as in Example 3 was carried out to produce a color conversion sheet. The color characteristics were measured by the above-described method using the produced color conversion sheet, and the result showed that there were a green light emission peak at 532 nm and a red light emission peak at 634 nm. The color gamut area ratio calculated by the above-described method was 98%. The relative luminance calculated by the above-described method was 108%. The haze value and the refractive index of each layer were measured by the above-described method. The results are shown in Table 3.

Example 12

Except that light scattering particles were not added for the color conversion layer (A), and the amount of light scattering particles in the color conversion layer (B) was 2 parts by weight, the same procedure as in Example 3 was carried out to produce a color conversion sheet. The color characteristics were measured by the above-described method using the produced color conversion sheet, and the result showed that there were a green light emission peak at 534 nm and a red light emission peak at 632 nm. The color gamut area ratio calculated by the above-described method was 95%. The relative luminance calculated by the above-described method was 110%. The haze value and the refractive index of each layer were measured by the above-described method. The results are shown in Table 3.

From a comparison of Examples 9 and 10 with Examples 11 and 12, we found that when only the color conversion layer (A) contains light scattering particles, the color gamut area is improved compared to when only the color conversion layer (B) contains light scattering particles.

From a comparison of Examples 11 and 12 with Examples 3, 9 and 10, we found that when only the color conversion layer (B) contains light scattering particles, the luminance is improved compared to when both the color conversion layer (A) and the color conversion layer (B) contain light scattering particles and when only the color conversion layer (A) contains light scattering particles.

Comparative Example 7

Except that the amount of light scattering particles in the color conversion layer (A) was 8 parts by weight, and light scattering particles were not added to the color conversion layer (B), the same procedure as in Example 3 was carried out to produce a color conversion sheet. The color characteristics were measured by the above-described method using the produced color conversion sheet, and the result showed that there were a green light emission peak at 523 nm and a red light emission peak at 641 nm. The color gamut area ratio calculated by the above-described method was 108%. The relative luminance calculated by the above-described method was 85%. The haze value and the refractive index of each layer were measured by the above-described method. The results are shown in Table 3.

Comparative Example 8

Except that light scattering particles were not added for the color conversion layer (A), and the amount of light scattering particles in the color conversion layer (B) was 8 parts by weight, the same procedure as in Example 3 was carried out to produce a color conversion sheet. The color characteristics were measured by the above-described method using the produced color conversion sheet, and the result showed that there were a green light emission peak at 536 nm and a red light emission peak at 630 nm. The color gamut area ratio calculated by the above-described method was 94%. The relative luminance calculated by the above-described method was 100%. The haze value and the refractive index of each layer were measured by the above-described method. The results are shown in Table 3.

From a comparison of Examples 9 and 10 with Comparative Example 7 and a comparison of Examples 11 and 12 with Comparative Example 8, we found that if the content of the particles is excessively large and the haze exceeds 90%, the luminance significantly decreases.

TABLE 3

| | | Example 9 | Example 10 | Example 11 | Example 12 | Comparative Example 7 | Comparative Example 8 |
|---|---|---|---|---|---|---|---|
| Color conversion layer (A) | Amount of scattering particles added [parts by weight] (v.s. resin) | 1.3 | 2 | 0 | 0 | 8 | 0 |
| | Emission peak [nm] | 527 | 525 | 532 | 534 | 523 | 536 |
| | Refractive index $n_{A1}$ | 1.49 | 1.49 | 1.49 | 1.49 | 1.49 | 1.49 |
| | Haze $H_A$ [%] | 48 | 67 | 1 | 1 | 98 | 1 |

TABLE 3-continued

|  |  | Example 9 | Example 10 | Example 11 | Example 12 | Comparative Example 7 | Comparative Example 8 |
|---|---|---|---|---|---|---|---|
| Resin layer | Refractive index $n_B$ | 1.41 | 1.41 | 1.41 | 1.41 | 1.41 | 1.41 |
| Color conversion layer (B) | Amount of scattering particles added [parts by weight] (v.s. resin) | 0 | 0 | 1.3 | 2 | 0 | 8 |
|  | Emission peak [nm] | 637 | 639 | 634 | 632 | 641 | 630 |
|  | Refractive index $n_{A2}$ | 1.49 | 1.49 | 1.49 | 1.49 | 1.49 | 1.49 |
|  | Haze $H_B$ [%] | 2 | 1 | 46 | 69 | 2 | 97 |
| Haze [%] |  | 52 | 72 | 51 | 74 | 99 | 99 |
| Relative luminance [%] |  | 97 | 93 | 108 | 110 | 85 | 100 |
| Color gamut area [%] |  | 105 | 108 | 98 | 95 | 108 | 94 |

Example 13

100 parts by weight of acrylic resin woven Cox KC-7000 manufactured by Kyoeisha Chemical Co., Ltd. as a resin, 0.4 parts by weight of G-1 as a light-emitting material (a), 0.01 parts by mass of R-1 as a light-emitting material (b), 0.6 parts by weight of S-1 as light scattering particles, and 300 parts by weight of toluene as a solvent were mixed, and the mixture was then stirred and defoamed at 1000 rpm for 20 minutes with a planetary stirring and defoaming apparatus "Mazerustar" (registered trademark) KK-400 (manufactured by Kurabo Industries Ltd.) to obtain a resin composition to form a color conversion layer.

A resin liquid composition for forming a resin layer was obtained in the same manner as in Example 1.

Next, the resin composition for forming a color conversion layer was applied onto a base layer of "Lumirror" (registered trademark) U48 (manufactured by Toray Industries, Inc., thickness: 50 μm) using a slit die coater, and heated and dried at 120° C. for 20 minutes to form a color conversion layer having an average film thickness of 18 μm.

A resin layer having an average film thickness of 10 μm was formed on the color conversion layer in the same manner as in Example 1.

Next, "Lumirror" U48 (registered trademark) (manufactured by Toray Industries, Inc., thickness: 50 μm) was heated and laminated on the resin layer to produce a color conversion sheet having a configuration of "base layer/color conversion layer/resin layer/base layer."

The refractive index of each layer was measured by the above-described method using the produced color conversion sheet. The results are shown in Table 4.

Examples 14 to 16 and Comparative Examples 4 to 6

Except that the compositions were changed to those shown in Table 4, the same procedure as in Example 13 was carried out to produce color conversion sheets, and evaluation was performed. In Comparative Example 6, the resin of the resin layer was changed to polyester "Vylon" (registered trademark) 270 manufactured by TOYOBO CO., LTD. The results are shown in Table 4.

As is apparent from a comparison between Example 13 and Comparative Example 4, the in-plane uniformity in Example 13 with the haze value being 20% or more was significantly better than that in Comparative Example 4 with the haze value being less than 20%.

From a comparison of Examples 13 to 16, we found that the larger the haze value, the better the in-plane uniformity. However, as shown in Comparative Example 5, we found that if the haze value exceeds 90%, the light durability is significantly deteriorated although the in-plane uniformity is good. In Examples 14 and 15, both in-plane uniformity and durability were particularly good.

From a comparison between Comparative Example 6 and Example 15, we found that if the refractive index $n_B$ of the resin layer is equal to or larger than the refractive index $n_A$ of the color conversion layer and the refractive index $n_C$ of the base layer, the light durability is significantly deteriorated.

TABLE 4

|  |  | Example 13 | Example 14 | Example 15 | Example 16 | Comparative Example 4 | Comparative Example 5 | Comparative Example 6 |
|---|---|---|---|---|---|---|---|---|
| Color conversion layer | Amount of scattering particles added [parts by weight] (v.s. resin) | 0.6 | 1.3 | 2 | 3 | 0.4 | 5 | 2 |
|  | Refractive index $n_A$ | 1.49 | 1.49 | 1.49 | 1.49 | 1.49 | 1.49 | 1.49 |
| Resin layer | Refractive index $n_B$ | 1.41 | 1.41 | 1.41 | 1.41 | 1.41 | 1.41 | 1.57 |
| Base layer | Refractive index $n_C$ | 1.57 | 1.57 | 1.57 | 1.57 | 1.57 | 1.57 | 1.57 |
| Haze [%] |  | 21 | 50 | 71 | 82 | 11 | 94 | 73 |
| In-plane uniformity Δu'v' |  | 0.018 | 0.013 | 0.011 | 0.009 | 0.025 | 0.007 | 0.012 |
| Durability (time of decrease by 10%) [hour] |  | 600 | 550 | 500 | 360 | 640 | 150 | 350 |

Example 19 to 21

Except that the compositions were changed to those shown in Table 5, the same procedure as in Example 11 was carried out to produce color conversion sheets, and evaluation was performed. The light scattering particles in Examples 19, 20 and 21 were changed to S-2, S-3 and S-4, respectively. The results are shown in Table 5.

From a comparison of Example 11 with Examples 19 to 21, we found that when the absolute value of the difference between the refractive index $n_{A2}$ of the color conversion layer and the refractive index $n_{D2}$ of the light scattering particle is within the above-described range, the total light transmittance is improved to obtain a color conversion sheet having a higher luminance.

TABLE 5

| | | Example 11 | Example 19 | Example 20 | Example 21 |
|---|---|---|---|---|---|
| Scattering particles | Scattering particle material | S-1 | S-2 | S-3 | S-4 |
| Color conversion layer (A) | Amount of scattering particles added [parts by weight] (v.s. resin) | 0 | 0 | 0 | 0 |
| | Refractive index $n_{A1}$ | 1.49 | 1.49 | 1.49 | 1.49 |
| | Haze $H_A$ [%] | 1 | 1 | 2 | 1 |
| Resin layer | Refractive index $n_B$ | 1.41 | 1.41 | 1.41 | 1.41 |
| Color conversion layer (B) | Amount of scattering particles added [parts by weight] (v.s. resin) | 1.3 | 4 | 20 | 10 |
| | Refractive index $n_{A2}$ | 1.49 | 1.49 | 1.49 | 1.49 |
| | Refractive index $n_{D2}$ | 2.6 | 1.63 | 1.45 | 1.43 |
| | Haze $H_B$ [%] | 46 | 48 | 46 | 47 |
| Haze [%] | | 52 | 54 | 52 | 53 |
| Total light transmittance [%] | | 80 | 91 | 95 | 93 |
| Relative luminance [%] | | 108 | 113 | 114 | 113 |
| In-plane uniformity Δu'v' | | 0.013 | 0.013 | 0.013 | 0.013 |
| Durability (time of decrease by 10%) [hour] | | 550 | 550 | 550 | 550 |

The invention claimed is:

1. A color conversion sheet that converts incident light into light having a wavelength different from that of the incident light, wherein
the color conversion sheet comprises at least a color conversion layer (A), a color conversion layer (B), a resin layer, and a base layer,
the color conversion layer (A) contains a light-emitting material (a) that exhibits light emission with a peak wavelength observed in a region of 500 nm or more and less than 580 nm,
the color conversion layer (B) contains a light-emitting material (b) that exhibits light emission with a peak wavelength observed in a region of 580 nm or more and 750 nm or less,
a haze value of the color conversion sheet is 20% or more and 90% or less, and $n_{A1}$, $n_{A2}$ and $n_B$ satisfy relationships (1) or (2), where $n_{A1}$ is a refractive index of the color conversion layer (A), $n_{A2}$ is a refractive index of the color conversion layer (B), and $n_B$ is a refractive index of the resin layer:

$$n_{A1} > n_B \text{ and } n_{A2} > n_B \qquad (1)$$

$$n_{A1} < n_B \text{ and } n_{A2} < n_B. \qquad (2)$$

2. The color conversion sheet according to claim 1, wherein the $n_{A1}$, $n_{A2}$ and $n_B$ satisfy relationship (1).

3. The color conversion sheet according to claim 1, wherein $n_{A1}$, $n_{A2}$ and $n_B$ satisfy $0.15 \geq n_{A1} - n_B \geq 0.05$ and $0.15 \geq n_{A2} - n_B \geq 0.05$.

4. The color conversion sheet according to claim 1, wherein $n_{A1}$, $n_{A2}$ and $n_B$ satisfy $0.15 \geq n_B - n_{A1} \geq 0.05$ and $0.15 \geq n_B - n_{A2} \geq 0.05$.

5. The color conversion sheet according to claim 1, wherein a haze value of the color conversion sheet is 50% or more and 75% or less.

6. The color conversion sheet according to claim 1, wherein, in the color conversion sheet, the color conversion layer (A), the resin layer and the color conversion layer (B) are arranged in this order, with one immediately adjacent to another.

7. The color conversion sheet according to claim 1, wherein the light-emitting material (a) and/or the light-emitting material (b) is an organic light-emitting material.

8. The color conversion sheet according to claim 7, wherein the organic light-emitting material contains a compound represented by general formula (1):

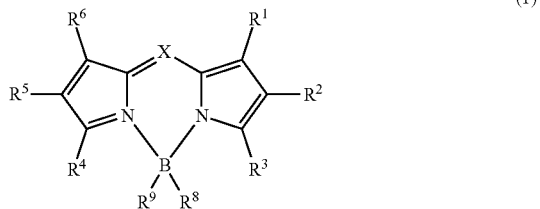

(1)

wherein X is C—$R^7$ or N; and $R^1$ to $R^9$ are the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

9. The color conversion sheet according to claim 1, wherein either or both of the color conversion layer (A) and the color conversion layer (B) contain light scattering particles.

10. The color conversion sheet according to claim 9, wherein a content of light scattering particles in the color conversion layer (A) is larger than a content of light scattering particles in the color conversion layer (B).

11. The color conversion sheet according to claim 9, wherein a content of light scattering particles in the color conversion layer (B) is larger than a content of light scattering particles in the color conversion layer (A).

12. The color conversion sheet according to claim 9, wherein the light scattering particles include particles selected from alumina particles, silica particles and silicone resin particles, and $n_{A1}$, $n_{A2}$, $n_{D1}$ and $n_{D2}$ satisfy $0.03 \leq |n_{A1}-n_{D1}| \leq 0.3$ and/or $0.03 \leq |n_{A2}-n_{D2}| \leq 0.3$, where $n_{A1}$ is a refractive index of the color conversion layer (A), $n_{A2}$ is a refractive index of the color conversion layer (B), $n_{D1}$ is a refractive index of light scattering particles contained in the color conversion layer (A), and $n_{D2}$ is a refractive index of light scattering particles contained in the color conversion layer (B).

13. The color conversion sheet according to claim 1, wherein the resin layer contains a silicone resin.

14. A light source unit comprising a light source and the color conversion sheet according to claim 1.

15. The light source unit according to claim 14, further comprising an optical sheet other than the color conversion sheet.

16. The light source unit according to claim 15, wherein the number of optical sheets present above the color conversion sheet is 2 or less.

17. A display comprising the light source unit according to claim 14.

18. A lighting device comprising the light source unit according to claim 14.

19. A color conversion sheet that converts incident light into light having a wavelength different from that of the incident light, wherein
the color conversion sheet comprises at least a color conversion layer (A), a color conversion layer (B), a resin layer, and a base layer,
the color conversion layer (A) contains a light-emitting material (a) that exhibits light emission with a peak wavelength observed in a region of 500 nm or more and less than 580 nm,
the color conversion layer (B) contains a light-emitting material (b) that exhibits light emission with a peak wavelength observed in a region of 580 nm or more and 750 nm or less,
a haze value of the color conversion sheet is 20% or more and 90% or less,
either or both of the color conversion layer (A) and the color conversion layer (B) contain light scattering particles, and
$|H_A-H_B| \geq 20\%$ is satisfied, where $H_A$ is a haze of the color conversion layer (A), and $H_B$ is a haze of the color conversion layer (B).

20. A color conversion sheet that converts incident light into light having a wavelength different from that of the incident light, wherein
the color conversion sheet comprises at least a color conversion layer, a resin layer and a base layer in this order,
the color conversion layer contains a light-emitting material (a) that exhibits light emission with a peak wavelength observed in a region of 500 nm or more and less than 580 nm and a light-emitting material (b) that exhibits light emission with a peak wavelength observed in a region of 580 nm or more and 750 nm or less,
a haze value of the color conversion sheet is 20% or more and 90% or less, and
$n_A > n_B$ and $n_B < n_C$ is satisfied, where $n_A$ is a refractive index of the color conversion layer, $n_B$ is a refractive index of the resin layer, and $n_C$ is a refractive index of the base layer.

* * * * *